(12) United States Patent
Toyoda et al.

(10) Patent No.: US 9,171,734 B1
(45) Date of Patent: Oct. 27, 2015

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Hitachi Kokusai Electric Inc., Tokyo (JP)

(72) Inventors: Kazuyuki Toyoda, Toyama (JP); Shun Matsui, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/490,882

(22) Filed: Sep. 19, 2014

(30) Foreign Application Priority Data

Aug. 25, 2014 (JP) .................................. 2014-170371

(51) Int. Cl.
*C23F 1/00* (2006.01)
*H01L 21/3065* (2006.01)
*H01L 21/02* (2006.01)
*H01L 21/67* (2006.01)
*C23C 16/50* (2006.01)
(Continued)

(52) U.S. Cl.
CPC ...... *H01L 21/3065* (2013.01); *C23C 16/45502* (2013.01); *C23C 16/45523* (2013.01); *C23C 16/50* (2013.01); *C23C 16/52* (2013.01); *H01J 37/3244* (2013.01); *H01L 21/0262* (2013.01); *H01L 21/67069* (2013.01)

(58) Field of Classification Search
CPC ............ H01J 37/3244; H01J 37/32449; H01J 37/32633

USPC ............ 156/345.29, 345.26, 345.33, 345.38, 156/345.54
See application file for complete search history.

(56) References Cited

U.S. PATENT DOCUMENTS 6,833,052 B2 * 12/2004 Li et al. .................... 156/345.48
2006/0196603 A1 * 9/2006 Lei et al. .................. 156/345.33
(Continued)

FOREIGN PATENT DOCUMENTS

JP          5-121337 A    5/1993
JP        H05-121337 A    5/1993
(Continued)

OTHER PUBLICATIONS

Office Action in corresponding Japanese Application No. 2014-170371, dated Mar. 16, 2015, along with English translation.

(Continued)

*Primary Examiner* — Lan Vinh
(74) *Attorney, Agent, or Firm* — Edell, Shapiro & Finnan LLC

(57) ABSTRACT

A substrate processing apparatus includes a processing chamber accommodating a substrate; first and second process gas supply units that respectively supply first and second process gases from above and laterally relative to the substrate; and first and second reactive gas supply units that respectively supply first and second reactive gases from above and laterally relative to the substrate. A control unit controls the other units such that a total amount of the first and second process gases supplied to a center portion of the substrate is different from that supplied to a peripheral portion of the substrate, or a total amount of the first and second reactive gases supplied to the center portion of the substrate is different from that supplied to the peripheral portion of the substrate.

19 Claims, 15 Drawing Sheets

(51) Int. Cl.
  *C23C 16/52* (2006.01)
  *C23C 16/455* (2006.01)
  *H01J 37/32* (2006.01)

(56) References Cited

U.S. PATENT DOCUMENTS

| | | | | |
|---|---|---|---|---|
| 2007/0175393 | A1* | 8/2007 | Nishimura et al. | 118/715 |
| 2009/0245971 | A1* | 10/2009 | Iizuka et al. | 411/403 |
| 2012/0111501 | A1* | 5/2012 | Iizuka | 156/345.34 |

FOREIGN PATENT DOCUMENTS

| JP | 1995508852 | 9/1995 |
|---|---|---|
| JP | 1995066291 | 10/1995 |
| JP | 1996508852 | 9/1996 |
| JP | 9-007960 A | 1/1997 |
| JP | H09-007960 A | 1/1997 |
| JP | 11-074098 A | 3/1999 |
| JP | H11-074098 A | 3/1999 |
| JP | 2001-168090 A | 6/2001 |
| JP | 0003311064 | 5/2002 |
| JP | 2004-140219 A | 5/2004 |
| JP | 2005-175242 A | 6/2005 |
| WO | WO9401874 | 1/1994 |
| WO | WO9424692 | 10/1994 |
| WO | WO2010058642 | 5/2010 |

OTHER PUBLICATIONS

Office Action in corresponding Japanese Patent Application No. 2014-170371, dated Jul. 10, 105, along with English Translation.

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This application claims foreign priority under 35 U.S.C. §119(a)-(d) to Application No. JP 2014-170371 filed on Aug. 25, 2014, entitled "Substrate Processing Apparatus, Method of Manufacturing Semiconductor Device and Non-Transitory Computer Readable Recording Medium," the entire contents of which are hereby incorporated by reference.

FIELD OF THE INVENTION

The present invention relates to a substrate processing apparatus, a method of manufacturing a semiconductor device and a non-transitory computer readable recording medium.

DESCRIPTION OF THE RELATED ART

As the integration degree of a large-scale integrated circuit (hereinafter referred to as "LSI") becomes higher, a circuit pattern becomes finer.

A device should be formed in a small size to accommodate a large number of semiconductor devices in a narrow area. To this end, the widths of and distances between patterns that are to be formed should be set to be small.

Recently, as a circuit pattern becomes finer, filling a fine structure and particularly, filling a structure having a gap (groove), which is deep in the vertical direction or that is narrow in the horizontal direction, with an oxide by chemical vapor deposition (CVD) has become technically limited. Also, it has been difficult to uniformly etch or process a substrate having a groove that is deep in the vertical direction by chemical mechanical polishing (CMP). Also, in order to increase the yield of a semiconductor device, it has been required to reduce a process time for each substrate and a process time for a whole manufacturing process of a semiconductor device.

Also, in order to increase the yield of the whole manufacturing process of a semiconductor device, it has been required to differently process a center portion and a peripheral portion of a substrate during a film forming process.

Recently, a semiconductor device, a representative example of which is an LSI, a dynamic random access memory (DRAM) or a flash memory has been developed to have a minimum processing dimension of less than 30 nm in width and a thin film thickness. Thus, it has become difficult to form a fine semiconductor device, improve the manufacturing throughput, or uniformly process a substrate while maintaining the quality thereof constant.

SUMMARY

It is an object of the present invention to provide a substrate processing apparatus capable of forming a film on a substrate to have different thicknesses and features within a plane of the substrate and improving the manufacturing throughput, a method of manufacturing a semiconductor device, and a non-transitory computer readable recording medium.

According to one aspect of the present invention, there is provided a substrate processing apparatus including: a processing chamber accommodating a substrate; a first process gas supply unit configured to supply a first process gas from above the substrate; a first reactive gas supply unit configured to supply a first reactive gas from above the substrate; a second process gas supply unit configured to supply a second process gas from a lateral direction with respect to the substrate; a second reactive gas supply unit configured to supply a second reactive gas from the lateral direction with respect to the substrate; and a control unit configured to control the first process gas supply unit, the second process gas supply unit, the first reactive gas supply unit, and the second reactive gas supply unit to: (a) supply the first process gas from above the substrate and the second process gas from the lateral direction with respect to the substrate; and (b) supply the first reactive gas from above the substrate and the second reactive gas from the lateral direction with respect to the substrate, wherein each of the steps (a) and (b) is performed at least once in a manner that: a total amount of the first process gas and the second process gas supplied to a center portion of the substrate is different from that of the first process gas and the second process gas supplied to a peripheral portion of the substrate; or a total amount of the first reactive gas and the second reactive gas supplied to the center portion of the substrate is different from that of the first reactive gas and the second reactive gas supplied to the peripheral portion of the substrate in at least one of the steps (a) and (b).

According to another aspect of the present invention, there is provided a method of manufacturing a semiconductor device, the method including: (a) supplying a first process gas from above a substrate and a second process gas from a lateral direction with respect to the substrate; and (b) supplying a first reactive gas from above the substrate and a second reactive gas from the lateral direction with respect to the substrate, wherein each of the steps (a) and (b) is performed at least once in a manner that a total amount of the first process gas and the second process gas supplied to a center portion of the substrate is different from that of the first process gas and the second process gas supplied to a peripheral portion of the substrate; or a total amount of the first reactive gas and the second reactive gas supplied to the center portion of the substrate is different from that of the first reactive gas and the second reactive gas supplied to the peripheral portion of the substrate in at least one of the steps (a) and (b).

According to another aspect of the present invention, there is provided a non-transitory computer readable recording medium causing a computer to perform: (a) supplying a first process gas from above a substrate and a second process gas from a lateral direction with respect to the substrate; and (b) supplying a first reactive gas from above the substrate and a second reactive gas from the lateral direction with respect to the substrate, wherein each of the sequences (a) and (b) is performed at least once in a manner that a total amount of the first process gas and the second process gas supplied to a center portion of the substrate is different from that of the first process gas and the second process gas supplied to a peripheral portion of the substrate; or a total amount of the first reactive gas and the second reactive gas supplied to the center portion of the substrate is different from that of the first reactive gas and the second reactive gas supplied to the peripheral portion of the substrate in at least one of the sequences (a) and (b).

DETAILED DESCRIPTION

Hereinafter, exemplary embodiments of the present invention will be described.

First Embodiment

A first embodiment of the present invention will be described with reference to the accompanying drawings below.

Structure of Substrate Processing Apparatus

First, a substrate processing apparatus 100 according to the first embodiment will be described.

The substrate processing apparatus 100 according to the present embodiment will now be described. The substrate processing apparatus 100 is a unit configured to form an insulating film, a metal film, or the like and is configured as a single-wafer type substrate processing apparatus as illustrated in FIG. 1.

Figure 1:
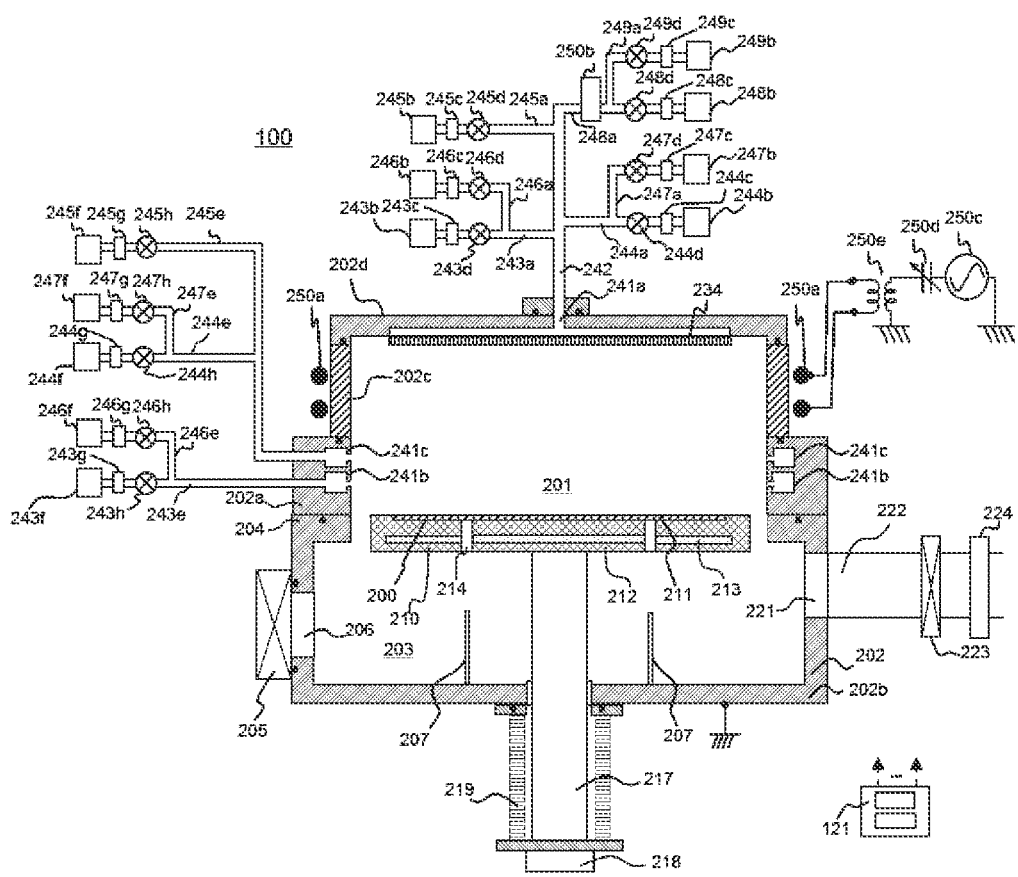
FIG. 1 is a schematic configuration diagram of a substrate processing apparatus according to a first embodiment of the present invention.

Referring to FIG. 1, the substrate processing apparatus 100 includes a process container 202. The process container 202 is configured, for example, as an airtight container having a flat cylindrical circular cross-section. Also, the process container 202 is formed, for example, of a metal material, e.g., aluminum (Al) or stainless steel (steel-use-stainless (SUS)) or quartz. In the process container 202, a process space (processing chamber) 201 for processing a wafer 200, such as a silicon wafer, serving as a substrate, and a transfer space 203 are formed. The process container 202 is configured by an upper container 202a, a lower container 202b, a quartz container 202c and a lid 202d. A space that is surrounded by the upper container 202a, the quartz container 202c and the lid 202d and located above a substrate placing table 212 will be hereinafter referred to as a 'process space 201', and a space that is surrounded by the lower container 202b and located below the substrate placing table 212 will be hereinafter referred to as the 'transfer space 203'.

At a side of the lower container 202b, a substrate loading exit 206 is installed adjacent to a gate valve 205. The wafer 200 is moved between adjacent transfer chambers (not shown) via the substrate loading exit 206. A plurality of lift pins 207 are installed on a bottom portion of the lower container 202b. Also, the lower container 202b is connected to an earth potential source.

In the process space 201, a substrate support unit 210 is installed to support the wafer 200. The substrate support unit 210 mainly includes a placing surface 211 on which the wafer 200 is placed, the substrate placing table 212 having the placing surface 211 on a surface thereof, and a heater 213 serving as a heating unit included in the substrate placing table 212. In the substrate placing table 212, through-holes 214 through which the lift pins 207 pass are installed in locations corresponding to the lift pins 207.

The substrate placing table 212 is supported by a shaft 217. The shaft 217 passes through a bottom portion of the process container 202 and is connected to a lifting mechanism 218 outside the process container 202. By lifting the shaft 217 and the substrate placing table 212 by operating the lifting mechanism 218, the wafer 200 placed on the placing surface 211 may be moved upward. Also, the circumference of a lower end portion of the shaft 217 is covered with a bellows 219 and the inside of the process container 202 is maintained in an airtight state.

The substrate placing table 212 is moved downward to the substrate support unit 210 to move the placing surface 211 to the substrate loading exit 206 (i.e., a wafer transfer position) so as to transfer the wafer 200, and is moved upward to move the wafer 200 to a processing position in the process space 201 (i.e., a wafer processing position) so as to process the wafer 200 as illustrated in FIG. 1.

In detail, when the substrate placing table 212 is moved downward to the wafer transfer position, upper end portions of the lift pins 207 protrude from an upper surface of the placing surface 211 to support the wafer 200 with the lift pins 207 from below. When the substrate placing table 212 is moved upward to the wafer processing position, the lift pins 207 are buried from the upper surface of the placing surface 211 so that the wafer 200 may be supported by the placing surface 211 from below. Also, the lift pins 207 are in direct contact with the wafer 200 and are thus preferably formed of, for example, quartz or alumina.

Activation Unit

A coil 250a is installed as an activation unit near the quartz container 202c. A variable condenser 250d and a high-frequency power source 250c are connected to the coil 250a via an insulation transformer 250e. By supplying high-frequency power to the coil 250a, a gas supplied into the processing chamber 201 may be excited to generate plasma.

Exhaust System

An exhaust port 221 serving as a first exhaust unit for exhausting an atmosphere in the processing chamber 201 is installed on an inner wall of the transfer space 203 (the lower container 202b). The exhaust port 221 is connected to an exhaust pipe 222. A pressure adjuster 223 such as an auto pressure controller (APC) configured to control the inside of the processing chamber 201 to have a predetermined pressure and a vacuum pump 224 are sequentially connected in series to the exhaust pipe 222. An exhaust system (exhaust line) mainly includes the exhaust port 221, the exhaust pipe 222, and the pressure adjuster 223. The vacuum pump 224 may be further included in the exhaust system (exhaust line).

Upper Gas Introduction Port

An upper gas introduction port 241a is installed at an upstream end of a gas rectification unit 234 installed at an upper portion of the process space 201 to provide various gases into the process space 201.

Upper Gas Supply Unit

A common gas supply pipe 242 is connected to the upper gas introduction port 241a installed at the upstream end of the gas rectification unit 234. A first process gas supply pipe 243a, a first reactive gas supply pipe 244a, a first purge gas supply pipe 245a and a cleaning gas supply pipe 248a are connected to the common gas supply pipe 242.

A first-element containing gas (first process gas) is mainly supplied from a first process gas supply unit including the first process gas supply pipe 243a). A second-element containing gas (first reactive gas) is mainly supplied from a second process gas supply unit including the first reactive gas supply pipe 244a. A purge gas is mainly supplied from a first purge gas supply unit including the first purge gas supply pipe 245a when a wafer is processed, and a cleaning gas is mainly supplied from the first purge gas supply unit when the processing chamber 201 is cleaned.

First Process Gas Supply Unit

At the first process gas supply pipe 243a, a first process gas source 243b, a mass flow controller (MFC) 243c which is a flow rate controller (flow rate control unit) and a valve 243d which is an opening/closing valve are sequentially installed from an upstream direction.

A gas containing a first element (first process gas) is supplied from the first process gas source 243b, and supplied to a gas rectification unit 234 via the MFC 243c, the valve 243d, the first process gas supply pipe 243a and the common gas supply pipe 242.

The first process gas is a source gas, i.e., one of the process gases. Here, the first element is, for example, silicon (Si). That is, the first process gas is, for example, a silicon-containing gas. For example, dichlorosilane (SiH2Cl2, abbreviated as 'DCS') gas may be used as silicon-containing gas. A source of the first process gas may have a solid, liquid, or gaseous state at normal temperature and pressure. When the first process gas has a liquid state at normal temperature and pressure, a vaporizer (not shown) may be installed between the first process gas source 243b and the MFC 243c. Here, it is assumed that the source is in a gaseous state.

First Carrier Gas Supply Unit

A downstream end of a first carrier gas supply pipe 246a is connected to the first process gas supply pipe 243a at a downstream side of the valve 243d. A carrier gas source 246b, an MFC 246c which is a flow rate controller (flow rate control unit) and a valve 246d which is an opening/closing valve are sequentially installed to the first carrier gas supply pipe 246a from an upstream direction. A first carrier gas supply unit includes at least the first carrier gas supply pipe 246a, the MFC 246c and the valve 246d.

Here, a carrier gas is, for example, nitrogen (N2) gas. In addition to the N2 gas, for example, a rare gas such as helium (He) gas, neon (Ne) gas, or argon (Ar) gas may be used as the carrier gas. The carrier gas acts as a carrier gas, a dilution gas, or a purge gas in a film forming process (operations S203 to S207).

A first-element containing gas supply unit (which may be also referred to as a silicon-containing gas supply unit) mainly includes the first process gas supply pipe 243a, the MFC 243c and the valve 243d.

The carrier gas source 246b and the first process gas supply pipe 243a may be further included in the first carrier gas supply unit.

The first process gas source 243b and the first carrier gas supply unit may be further included in the first-element containing gas supply unit.

First Reactive Gas Supply Unit

A first reactive gas source 244b, an MFC 244c which is a flow rate controller (flow rate control unit) and a valve 244d which is an opening/closing valve are sequentially installed at an upstream end of the first reactive gas supply pipe 244a from the upstream side.

A gas containing a second element (hereinafter referred to as a 'first reactive gas') is supplied from the first reactive gas source 244b and supplied to the gas rectification unit 234 via the MFC 244c, the valve 244d, the first reactive gas supply pipe 244a and the common gas supply pipe 242.

The first reactive gas is one of the process gases. The first reactive gas may be considered as a modifying gas.

Here, the first reactive gas contains a second element that is different from the first element. The second element includes, for example, at least one among oxygen (O), nitrogen (N), carbon (C) and hydrogen (H) which are elements that are likely to react with (or be bound to) the first element. In the present embodiment, the first reactive gas is, for example, a nitrogen-containing gas. In detail, ammonia (NH3) gas is used as the nitrogen-containing gas.

A first reactive gas supply unit mainly includes the first reactive gas supply pipe 244a, the MFC 244c and the valve 244d.

Second Carrier Gas Supply Unit

A downstream end of a second carrier gas supply pipe 247a is connected to the first reactive gas supply pipe 244a at a downstream side of the valve 244d. A carrier gas source 247b, an MFC 247c which is a flow rate controller (flow rate control unit) and a valve 247d which is an opening/closing valve are sequentially installed at the second carrier gas supply pipe 247a from the upstream direction. A second carrier gas supply unit includes at least the second carrier gas supply pipe 247a, the MFC 247c and the valve 247d.

A carrier gas is supplied to the gas rectification unit 234 from the second carrier gas supply pipe 247a via the MFC 247c, the valve 247d and the first reactive gas supply pipe 247a.

The carrier gas source 247b and the first reactive gas supply pipe 244a may be further included in the second carrier gas supply unit.

The first reactive gas source 244b and the second carrier gas supply unit may be further included in the first reactive gas supply unit.

First Purge Gas Supply Unit

A first purge gas source 245b, an MFC 245c which is a flow rate controller (flow rate control unit) and a valve 245d which is an opening/closing valve are sequentially installed at the first purge gas supply pipe 245a from the upstream direction.

An inert gas is supplied as a purge gas from the first purge gas source 245b, and supplied to the gas rectification unit 234 via the MFC 245c, the valve 245d, the first purge gas supply pipe 245a and the common gas supply pipe 242.

Here, the inert gas is, for example, nitrogen (N2) gas. In addition to the N2 gas, for example, a rare gas such as helium (He) gas, neon (Ne) gas, or argon (Ar) gas may be used as the inert gas.

A first purge gas supply unit (which is also referred to as a purge gas supply unit) mainly includes the first purge gas supply pipe 245a, the MFC 245c and the valve 245d.

The inventors of the present invention have found that the degree of flatness of a semiconductor device to be finally formed can be improved by forming a film on the wafer 200 such that the thickness or quality of the film is different, for example, at a center portion and a peripheral portion of the wafer 200 during processing of the wafer 200 even when the uniformity of the wafer 200 processed in an etching process or a CMP process performed after the forming of the film is different at the center portion and the peripheral portion of the wafer 200.

A structure of an apparatus that enables to form a film such that the thickness or quality of the film is different at the center portion and the peripheral portion of the wafer 200 will be described below.

Flank Gas Introduction Port

As illustrated in FIG. 1, flank gas introduction ports 241b and 241c may be installed at side surfaces of the upper container 202a and a rate of the amounts of gases to be supplied via the upper gas introduction port 241a and the flank gas introduction ports 241b and 241c may be changed to form a film such that the thickness or quality of the film is different at the center portion and the peripheral portion of the wafer 200. The flank gas introduction ports 241b and 241c are installed to surround around the wafer 200. A second process gas supply pipe 243e is connected to the flank gas introduction port 241b, and a second reactive gas supply pipe 244e is connected to the flank gas introduction port 241c.

Second Process Gas Supply Unit

A second process gas source 243f, an MFC 243g and a valve 243h are sequentially installed at the second process gas supply pipe 243e from the upstream direction.

A gas containing the first element described above is supplied from the second process gas source 243f, and supplied to the flank gas introduction port 241b via the MFC 243g, the valve 243h and the second process gas supply pipe 243e. A second process gas is supplied along the outer circumference of the wafer 200 via the gas introduction port 241b.

The second process gas is similar to the first process gas described above. Also, the second process gas may be a gas containing a third element that is different from the first element.

Third Carrier Gas Supply Unit

A downstream end of a third carrier gas supply pipe 246e is connected to the second process gas supply pipe 243e at a downstream side of the valve 243h. A carrier gas source 246f, an MFC 246g and a valve 246h are sequentially installed at the third carrier gas supply pipe 246e from the upstream direction. A third carrier gas supply unit includes at least the third carrier gas supply pipe 246e, the MFC 246g, and the valve 246h.

The second process gas supply unit mainly includes the second process gas supply pipe 243e, the MFC 243g and the valve 243h.

Also, the second process gas supply unit may include the third carrier gas supply unit.

Second Reactive Gas Supply Unit

A second reactive gas source 244f, an MFC 244g and a valve 244h are sequentially installed at the second reactive gas supply pipe 244e from the upstream direction.

A gas containing the second element described above is supplied from the second reactive gas source 244f and supplied to the flank gas introduction port 241c via the MFC 244g, the valve 244h and the second reactive gas supply pipe 244e.

Fourth Carrier Gas Supply Unit

A downstream end of a fourth carrier gas supply pipe 247e is connected to the second reactive gas supply pipe 244e at a downstream side of the valve 244h. A carrier gas source 247f, an MFC 247g and a valve 247h are sequentially installed at the fourth carrier gas supply pipe 247e from the upstream direction.

A fourth carrier gas supply unit mainly includes the fourth carrier gas supply pipe 244e, the MFC 244g and the valve 244h.

A fourth carrier gas supply unit mainly includes a fourth carrier gas supply pipe 247e, an MFC 247g and a valve 247h. The fourth carrier gas supply unit may be included in a second reactive gas supply unit.

Second Purge Gas Supply Unit

A second purge gas source 245f, an MFC 245g and a valve 245h are sequentially installed at a second purge gas supply pipe 245e, which constitutes a second purge gas supply unit, from the upstream direction.

An inert gas is supplied as a purge gas from the second purge gas source 245f and supplied to the flank gas introduction port 241c via the MFC 245g, the valve 245h and the second purge gas supply pipe 245e.

Here, the inert gas is, for example, nitrogen (N2) gas. In addition to the N2 gas, for example, a rare gas such as helium (He) gas, neon (Ne) gas, or argon (Ar) gas may be used as the inert gas.

A second purge gas supply unit (which is also referred to as a purge gas supply unit) mainly includes the second purge gas supply pipe 245e, the MFC 245g and the valve 245h.

Cleaning Gas Supply Unit

A cleaning gas source 248b, an MFC 248c, a valve 248d and a remote plasma unit (RPU) 250b are sequentially installed at the cleaning gas supply pipe 248a from the upstream direction.

A cleaning gas is supplied from the cleaning gas source 248b, and supplied to the gas rectification unit 234 via the MFC 248c, the valve 248d, the RPU 250b, the cleaning gas supply pipe 248a and the common gas supply pipe 242.

A downstream end of a fifth carrier gas supply pipe 249a is connected to the cleaning gas supply pipe 248a at a downstream side of the valve 248d. A fifth carrier gas source 249b, an MFC 249c and a valve 249d are sequentially installed at the fifth carrier gas supply pipe 249a from the upstream direction.

A cleaning gas supply unit mainly includes the cleaning gas supply pipe 248a, the MFC 248c, and the valve 248d. The cleaning gas source 248b, the fifth carrier gas supply pipe 249a and the RPU 250b may be included in the cleaning gas supply unit.

Also, an inert gas supplied from the fifth carrier gas source 249b may be supplied to be used as a carrier gas or a dilution gas of a cleaning gas.

A cleaning gas supplied from the cleaning gas source 248b acts as a cleaning gas for removing a by-product attached to the gas rectification unit 234 or the processing chamber 201 in a cleaning process.

Here, the cleaning gas is, for example, nitrogen trifluoride (NF3) gas. Also, for example, hydrofluoric acid (HF) gas, chlorine trifluoride (ClF3) gas, fluorine (F2) gas, or a combination thereof may be used as the cleaning gas.

Control Unit

As illustrated in FIG. 1, the substrate processing apparatus 100 includes a controller 121 configured to control operations of various elements of the substrate processing apparatus 100.

Figure 2:
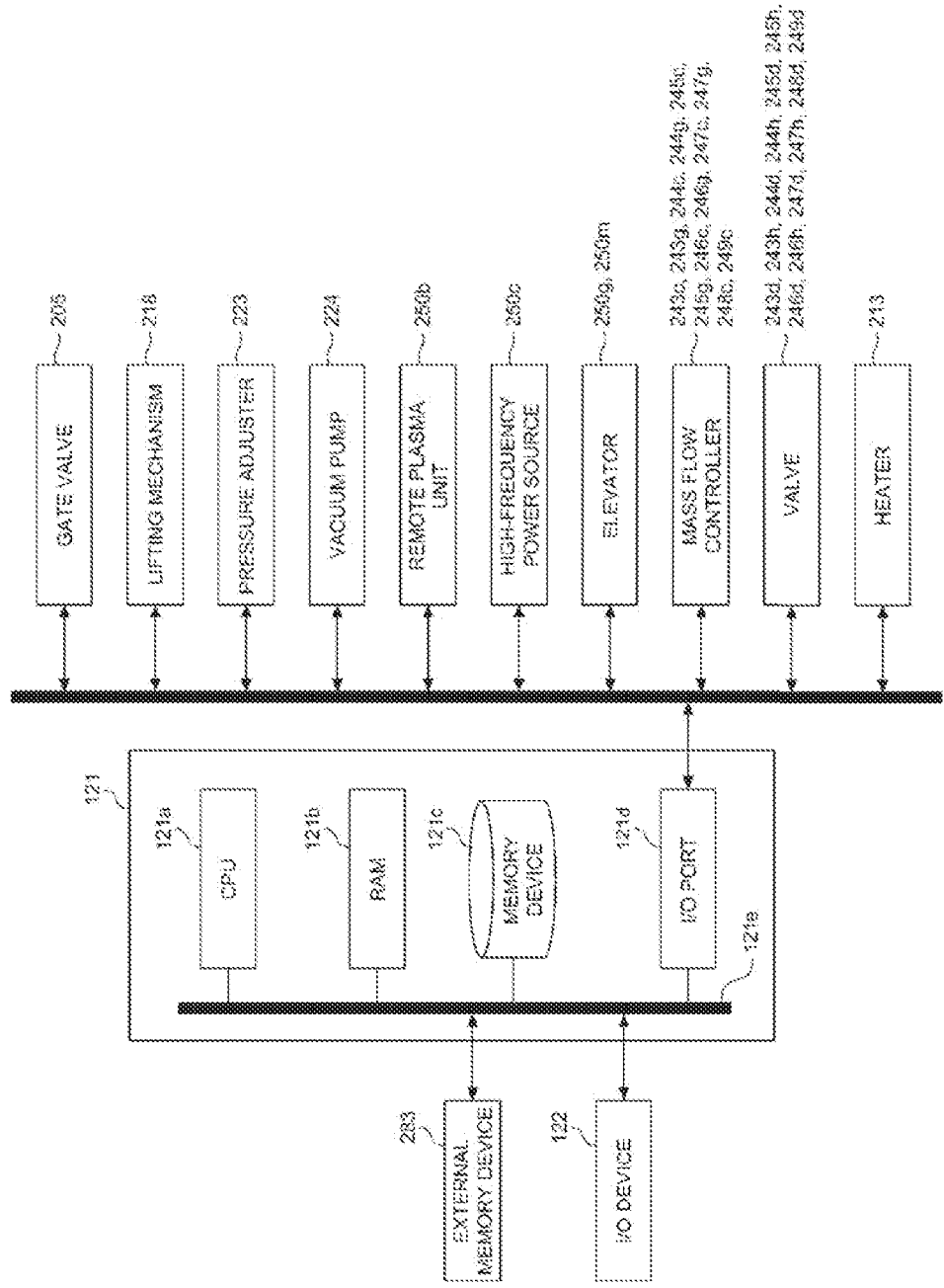
FIG. 2 is a schematic configuration diagram of a controller according to an embodiment of the present invention.

As illustrated in FIG. 2, the controller 121 which is a control unit (control means) is configured as a computer including a central processing unit (CPU) 121a, a random access memory (RAM) 121b, a memory device 121c and an input/output (I/O) port 121d. The RAM 121b, the memory device 121c and the I/O port 121d are configured to exchange data with the CPU 121a via an internal bus 121e. The controller 121 is configured to be connected to an I/O device 122 embodied as, for example, a touch panel or an external memory device 283.

The memory device 121c includes, for example, a flash memory, a hard disk memory (HDD), etc. In the memory device 121c, a control program for controlling an operation of a substrate processing apparatus, a process recipe including the order or conditions of substrate processing which will be described below, and the like is stored to be readable. The process recipe is a combination of sequences of a substrate processing process which will be described below to obtain a desired result when the sequences are performed by the controller 121, and acts as a program. Hereinafter, the process recipe, the control program, etc. will be referred to together simply as a 'program.' Also, when the term 'program' is used in the present disclosure, it may be understood as including only a process recipe, only a control program, or both of the process recipe and the control program. The RAM 121b is configured as a memory area (work area) in which a program or data read by the CPU 121a is temporarily retained.

The I/O port 121d is connected to the gate valve 205, the lifting mechanism 218, the pressure adjuster 223, the vacuum pump 224, the RPU 250b, the MFCs 243c, 243g, 244c, 244g, 245c, 245g, 246c, 246g, 247c, 247g, 248c and 249c, the valves 243d, 243h, 244d, 244h, 245d, 245h, 246d, 246h, 247d, 247h, 248d and 249d, and the heater 213, etc.

The CPU 121a is configured to read and execute the control program from the memory device 121c and to read the process recipe from the memory device 121c according to a manipulation command input via the I/O device 122. According to the read process recipe, the CPU 121a is configured to control opening/closing the gate valve 205; control upward/downward movement of the lifting mechanism 218; control adjustment of pressure using the pressure adjuster 223; control the vacuum pump 224 to be 'on'/'off'; control excitation of a gas using the RPU 250b; control flow rates of gases using the MFCs 243c, 243g, 244c, 244g, 245c, 245g, 246c, 246g, 247c, 247g, 248c and 249c; control gases to be 'on'/'off' using the valves 243d, 243h, 244d, 244h, 245d, 245h, 246d, 246h, 247d, 247h, 248d and 249d; and control a temperature control of the heater 213.

The controller 121 is not limited to a dedicated computer and may be configured as a general-purpose computer. For example, the controller 121 according to the present embodiment may be configured by preparing the external memory device 283 storing a program as described above, such as a magnetic disk (e.g., a magnetic tape, a flexible disk, a hard disk, etc.), an optical disc (e.g., a compact disc (CD), a digital versatile disc (DVD), etc.), a magneto-optical (MO) disc, or a semiconductor memory (e.g., a Universal Serial Bus (USB) memory, a memory card, etc.), and then installing the program in a general-purpose computer using the external memory device 283. However, means for supplying a program to a computer are not limited to using the external memory device 283. For example, a program may be supplied to a computer using communication means, e.g., the Internet or an exclusive line, without using the external memory device 283. The memory device 121c or the external memory device 283 may be configured as a non-transitory computer-readable recording medium. Hereinafter, the memory device 121c and the external memory device 283 may also be referred to together simply as a 'recording medium.' When the term 'recording medium' is used in the present disclosure, it may be understood as only the memory device 121c, only the external memory device 283, or both of the memory device 121c and the external memory device 283.

(2) Substrate Processing Process

Next, a process of forming a silicon nitride (SixNy) film using DCS gas and ammonia (NH3) gas which is a process of manufacturing a semiconductor device will be described as an example of a substrate processing process.

Figure 3:
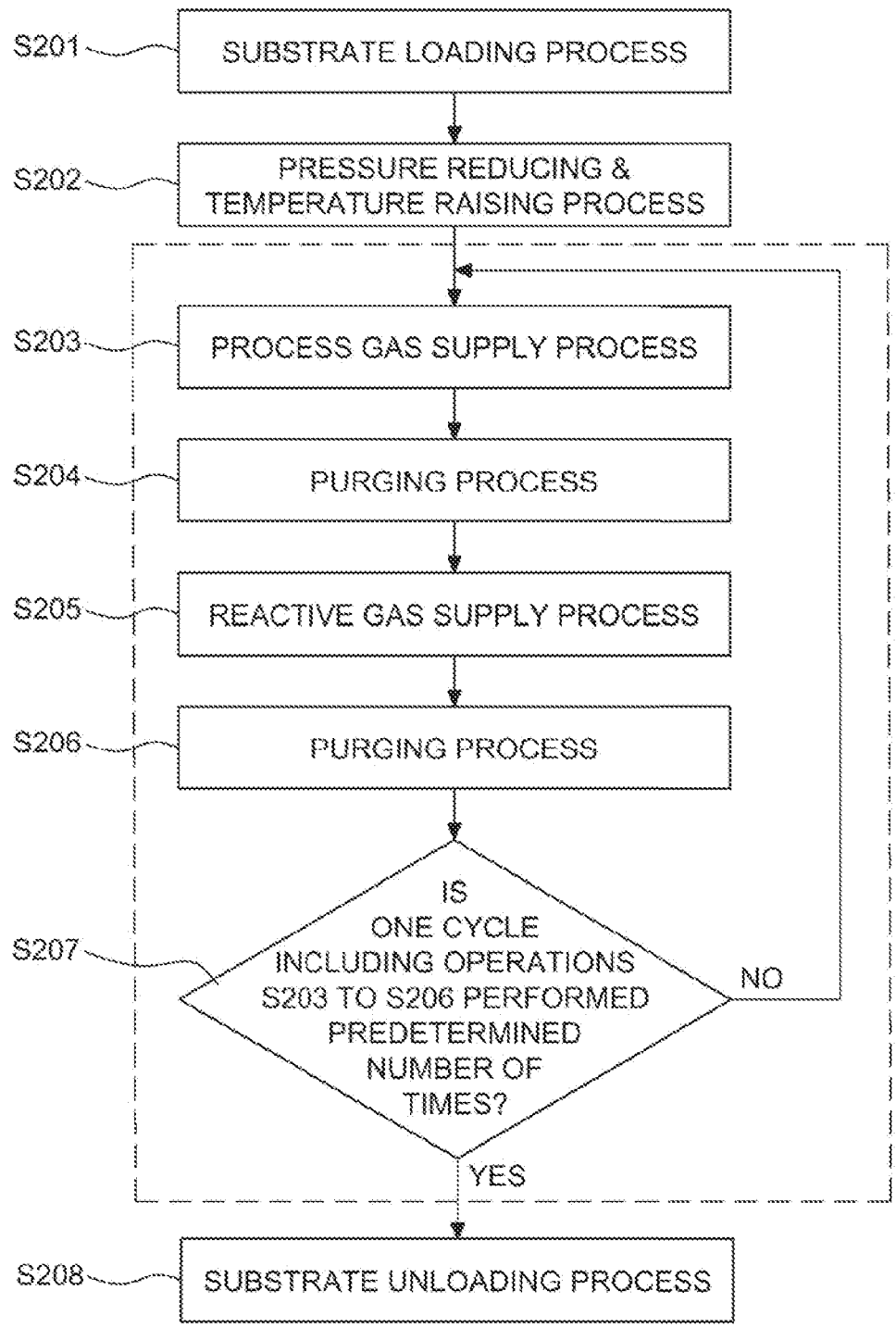
FIG. 3 is a flowchart of a substrate processing process according to an embodiment of the present invention.

FIG. 3 is a sequence diagram of a substrate processing process performed by substrate processing apparatus according to an embodiment of the present invention. In FIG. 3, sequences of a process of forming a silicon nitride (SixNy) film on the wafer 200 as a substrate by performing a treatment using plasma are illustrated.

Substrate Loading Process (Operation S201)

In order to form a film, first, the wafer 200 is loaded into the processing chamber 201. In detail, the substrate support unit 210 is moved downward by the lifting mechanism 218 such that the lift pins 207 protrude from an upper surface of the substrate support unit 210 via the through-holes 214. Also, the inside of the processing chamber 201 is regulated to have a predetermined pressure, and the gate valve 205 is opened to place the wafer 200 on the lift pins 207 via the gate valve 205. After the wafer 200 is placed on the lift pins 207, the substrate support unit 210 is moved upward to a predetermined position by the lifting mechanism 218 to place the wafer 200 on the substrate support unit 210 from the lift pins 207.

Pressure Reducing & Temperature Raising Process (Operation S202)

Then, the inside of the processing chamber 201 is exhausted via the exhaust pipe 222 such that the inside of the processing chamber 201 has a predetermined pressure (degree of vacuum). In this case, the degree of openness of an APC valve as the pressure adjuster 223 is feedback controlled based on a pressure measured by a pressure sensor. Also, the amount of electric power to be supplied to the heater 213 is feedback controlled based on a temperature sensed by a temperature sensor (not shown) such that the inside of the processing chamber 201 has a predetermined temperature. In detail, a susceptor is heated beforehand and allowed to stand for a predetermined time after which the temperature of the wafer 200 or the susceptor is constantly maintained. During this operation, moisture remaining in the processing chamber 201, a gas escaped from a member, etc. is removed by vacuum exhaustion or by purging performed by supplying N2 gas, thereby completing a prior preparation for a film forming process.

After the prior preparation for the film forming process is completed, a process gas supply process (operation S203), a purging process (operation S204), a reactive gas supply process (operation S205) and a purging process (operation S206) are performed.

Process Gas Supply Process (Operation S203)

Figure 4:
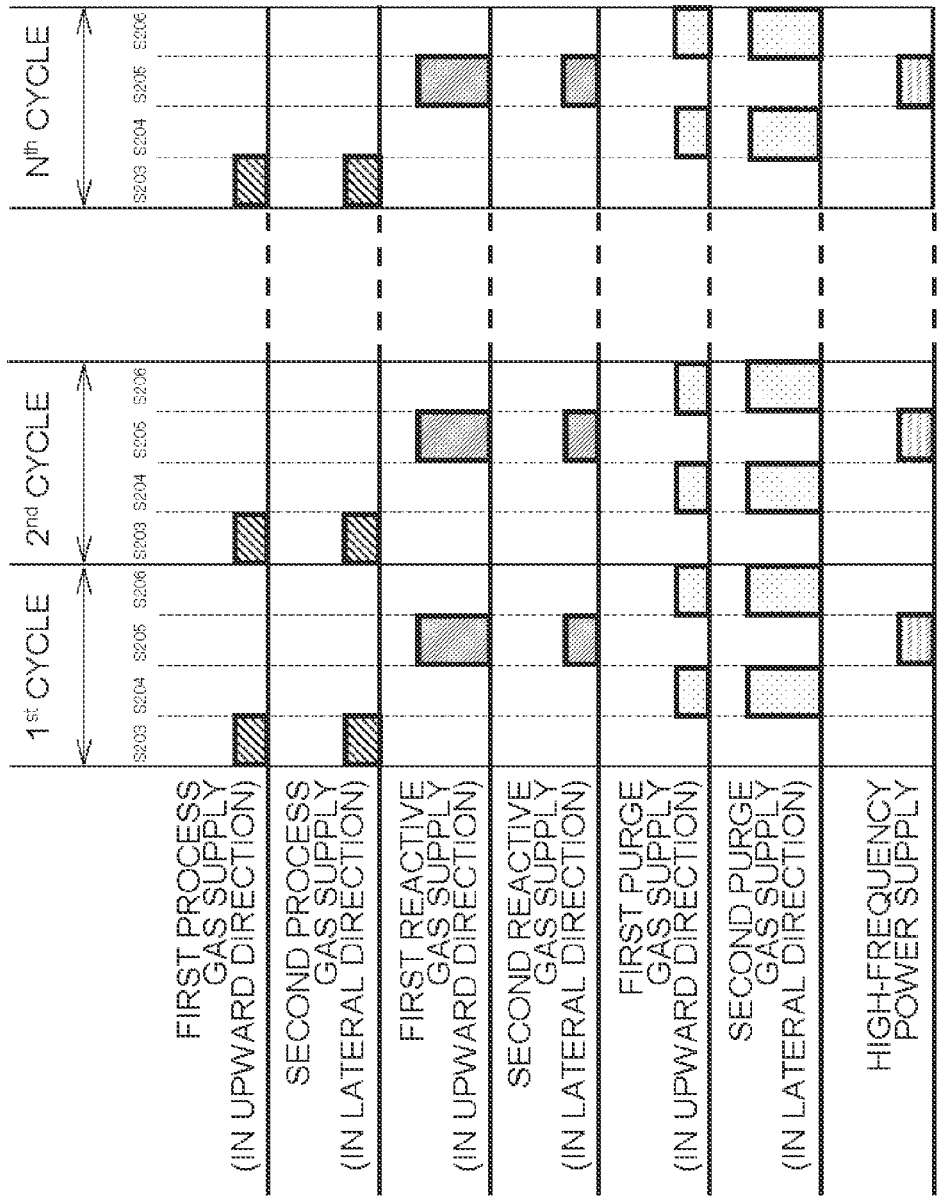
FIG. 4 is a diagram illustrating a sequence of supplying a gas according to an embodiment of the present invention.

Next, as illustrated in FIG. 4, DCS gas is supplied as a first process gas (source gas) into the processing chamber 201 via the first process gas supply unit. Also, the inside of the processing chamber 201 is continuously exhausted using the exhaust system to control the inside pressure of the processing chamber 201 to be equal to a predetermined pressure (first pressure). In detail, the valve 243d of the first process gas supply pipe 243a and the valve 246d of the first carrier gas supply pipe 246a are opened to supply the DCS gas into the first process gas supply pipe 243a and N2 gas into the first carrier gas supply pipe 246a. The DCS gas is supplied via the first process gas supply pipe 243a and the flow rate of the DCS gas is adjusted by the MFC 243c. The N2 gas is supplied via the first carrier gas supply pipe 246a and the flow rate of the N2 gas is adjusted by the MFC 246c. The flow-rate adjusted DCS gas is mixed with the flow-rate adjusted N2 gas in the first process gas supply pipe 243a, supplied into the processing chamber 201 via the gas rectification unit 234, and exhausted via the exhaust pipe 222. In this case, in the processing chamber 201, the first process gas supplied from a center portion of the gas rectification unit 234 is supplied at a high density to a center portion of the wafer 200, supplied at a low density to a peripheral portion of the wafer 200, compared to the center portion of the wafer 200, and exhausted via the exhaust pipe 222. A process gas supplied from a peripheral portion of the gas rectification unit 234 is supplied to the peripheral portion of the wafer 200 and exhausted via the exhaust pipe 222.

Also, DCS gas is supplied as a second process gas into the processing chamber 201 via the flank gas introduction port 241b. In detail, the valve 243h of the second process gas supply pipe 243e and the valve 246h of the third carrier gas supply pipe 246e are opened to supply the DCS gas to the second process gas supply pipe 243e and N2 gas to the third carrier gas supply pipe 246e. The DCS gas is supplied via the second process gas supply pipe 243e and the flow rate of the DCS signal is adjusted by the MFC 243g. The N2 gas is supplied via the third carrier gas supply pipe 246e and the flow rate of the N2 gas is adjusted by the MFC 246g. The flow-rate adjusted DCS gas is mixed with the flow-rate adjusted N2 gas in the second process gas supply pipe 243e, supplied into the heated or pressure-reduced processing chamber 201 via the flank gas introduction port 241b, and exhausted via the exhaust pipe 222. Here, most of the second process gas does not reach the center portion of the wafer 200 and flows to the exhaust pipe 222.

Also, the supply state of the second process gas supplied to the center portion of the wafer 200 may be controlled by adjusting the height of the substrate placing table 212. The concentration of a gas supplied to the peripheral portion of the wafer 200 may be increased by moving the placing surface 211 of the substrate placing table 212 upward to the vicinity of a lower end of the flank gas introduction port 241c. The concentration of the gas supplied to the peripheral portion of the wafer 200 may be reduced to be lower than that of the gas supplied to the center portion of the wafer 200 and the concentration of the gas supplied to the center portion of the wafer 200 may be increased by moving the substrate placing table 212 downward.

In this case, the first process gas may be supplied simultaneously with the second process gas.

In the present embodiment, a supply amount means a gas flow rate.

In this case, the DCS gas is supplied to the wafer 200 [source gas (DCS) supply process]. The DCS gas is supplied into the processing chamber 201 at a predetermined pressure (first pressure, e.g., in a range of 100 Pa to 10,000 Pa). The DCS gas is supplied to the wafer 200 under this condition. By supplying the DCS gas, a silicon-containing layer is adsorbed (chemically or physically adsorbed) onto the wafer 200. The silicon-containing layer means a layer containing either silicon (Si) or silicon and chlorine (Cl).

Also, by supplying the first process gas in a larger amount than the second process gas, the silicon-containing layer is more thickly formed on the center portion of than on the peripheral portion of the wafer 200.

Purging Process (Operation S204)

After the silicon-containing layer is adsorbed onto the wafer 200, the valve 243d of the first process gas supply pipe 243a and the valve 243h of the second process gas supply pipe 243e are closed to stop the supply of the DCS gas. In this case, the pressure adjuster 223 of the exhaust pipe 222 is fully opened to vacuum-exhaust the inside of the processing chamber 201 with the vacuum pump 224, and the DCS gas (that did not react or after contributing to the formation of the silicon-containing layer) remaining in the processing chamber 201 is eliminated from the inside of the processing chamber 201. Also, the valve 245d of the first purge gas supply unit may be opened to supply an inert gas into the first purge gas supply pipe 245a and a gas flowing in the processing chamber 201 may be extruded via the gas rectification unit 234. The flow rate of the inert gas flowing through the first purge gas supply pipe 245a is controlled by the MFC 245c. Here, in the processing chamber 201, a first purge gas supplied from a center portion of the gas rectification unit 234 is supplied to the center portion of the wafer 200, supplied to the peripheral portion of the wafer 200, and exhausted via the exhaust pipe 222. The first purge gas supplied from a peripheral portion of the gas rectification unit 234 is supplied to the peripheral portion of the wafer 200 and exhausted via the exhaust pipe 222.

Also, the valve 245h of the second purge gas supply unit is opened to supply an inert gas to the second purge gas supply pipe 245e and a gas flowing in the processing chamber 201 is extruded via the flank gas introduction port 241c. The flow rate of the inert gas flowing through the second purge gas supply pipe 245e is controlled by the MFC 245g.

Also, N2 gas may be continuously supplied as an inert gas into the processing chamber 201 while the valve 246d and the valve 246h are open. The N2 gas that is continuously supplied via the valve 246d and the valve 246h acts as a purge gas. Due to the N2 gas, the first process gas supply pipe 243a, the common gas supply pipe 242 and the second process gas supply pipe 243e, an effect of eliminating the DCS gas (that did not react or after contributing to the formation of the silicon-containing layer) remaining in the processing chamber 201 may be greatly increased.

Also, in this case, a gas remaining in the processing chamber 201, the gas rectification unit 234, the flank gas introduction port 241b, etc. is preferably completely eliminated but may not be completely purged (the inside of the processing chamber 201 may not be completely purged).

In this case, the temperature of the heater 213 is set to be maintained at a temperature that is in a range of 300° C. to 650° C., preferably, a range of 300° C. to 600° C., and more preferably, a range of 300° C. to 550° C., similar to when a source gas is supplied to the wafer 200. The flow rate of the N2 gas supplied as a purge gas via each inert gas supply unit is set, for example, to be in a range of 100 sccm to 20,000 sccm. In addition to the N2 gas, a rare gas such as Ar, He, Ne, or Xe may be used as the purge gas.

Reactive Gas Supply Process (Operation S205)

After the DCS gas remaining in the processing chamber 201 is removed, the supply of the purge gas is stopped and NH3 gas is supplied as a first reactive gas. Also, the inside of the processing chamber 201 is continuously exhausted by the exhaust system to control the inside pressure of the processing chamber 201 to be equal to a predetermined pressure (a second pressure). In detail, the valve 244d of the first reactive gas supply pipe 244a is opened to supply NH3 gas into the first reactive gas supply pipe 244a. The NH3 gas is supplied via the first reactive gas supply pipe 244a and the flow rate thereof is adjusted by the MFC 244c. The flow-rate adjusted NH3 gas is supplied into the processing chamber 201 via the gas rectification unit 234 and exhausted via the exhaust pipe 222. In this case, in the processing chamber 201, the first reactive gas supplied from the center portion of the gas rectification unit 234 is supplied at a high concentration to the center portion of the wafer 200, supplied to the peripheral portion of the wafer 200, and exhausted via the exhaust pipe 222. The first reactive gas supplied from the peripheral portion of the gas rectification unit 234 is supplied to the peripheral portion of the wafer 200 and exhausted via the exhaust pipe 222.

Also, NH3 gas is supplied as a second reactive gas via the flank gas introduction port 241c. In detail, the valve 244h of the second reactive gas supply pipe 244e is opened to supply the NH3 gas into the second reactive gas supply pipe 244e. The flow rate of the NH3 gas is adjusted by the MFC 244c and the flow-rate adjusted NH3 gas flows into the second reactive gas supply pipe 244e. The flow-rate adjusted NH3 gas is supplied into the processing chamber 201 which is in a reduced-pressure state via the flank gas introduction port 241c, and exhausted via the exhaust pipe 222. Here, the second reactive gas is supplied such that an effect of supplying the second reactive gas is lower than that of supplying the first reactive gas. The effect of supplying the first reactive gas means an effect of causing the thickness of a film on the center portion of the wafer 200 to be thicker than that of the film on the peripheral portion of the wafer 200. The effect of supplying the second reactive gas means an effect of causing the thickness of a film on the center portion of the wafer 200 to be thinner than that of the film on the peripheral portion of the wafer 200. Also, an effect of supplying a gas may be understood as affecting not only the thickness of a film on the center portion and the peripheral portion of the wafer 200 but also the quality of the film on the center portion of the wafer 200 and the peripheral portion of the wafer 200 to be different.

Also, the supply state of the second reactive gas supplied to the wafer 200 may be controlled by adjusting the height of the substrate placing table 212. The concentration of a gas to be supplied to the peripheral portion of the wafer 200 may be improved by moving the placing surface 211 of the substrate placing table 212 upward to the vicinity of a lower end of the flank gas introduction port 241c, and may be reduced to be lower than the concentration of the gas to be supplied to the center portion of the wafer 200 by moving the substrate placing table 212 downward so as to increase the concentration of the gas at the center portion of the wafer 200.

The NH3 gas supplied to the wafer 200 reacts with the silicon-containing layer formed on the wafer 200 to nitridate silicon and discharge impurities such as hydrogen, chlorine, hydrogen chloride, etc. A distribution of the degree of the reaction occurring on the wafer 200 may be controlled by adjusting the location of the substrate placing table 212, the amount of the first reactive gas supplied from an upward direction, and the amount of the first reactive gas supplied from a lateral direction.

Purging Process (Operation S206)

After the reactive gas supply process, the supply of the reactive gas is stopped and a purging process is performed similar to the purging process (operation S204). By performing the purging process, the NH3 gas (that did not react or after contributing to the nitriding of the silicon) remaining in the first reactive gas supply pipe 244a, the common gas supply pipe 242, the second reactive gas supply pipe 244e, the processing chamber 201, etc. may be eliminated. By eliminating the residual gas, an undesired film may be suppressed from being formed due to the residual gas.

Repetitive Process (Operation S207)

A silicon nitride (SixNy) layer is deposited on the wafer 200 at a predetermined thickness by performing the process gas supply process (operation S203), the purging process (operation S204), the reactive gas supply process (operation S205), and the purging process (operation S206) once. By repeatedly performing these processes, the thickness of the silicon nitride layer formed on the wafer 200 may be controlled. These processes may be repeatedly performed a predetermined number of times until the thickness of the silicon nitride layer becomes equal to a desired level.

Substrate Unloading Process (Operation S208)

After these processes are repeatedly performed the predetermined number of times in the repetitive process (operation S207), a substrate unloading process (operation S208) is performed to unload the wafer 200 from the processing chamber 201. In detail, the temperature of the wafer 200 is lowered to a temperature sufficient for the wafer 200 to be unloaded, and the inside of the processing chamber 201 is purged using an inert gas and regulated to a pressure sufficient for transfer. After the pressure regulation, the substrate support unit 210 is moved downward by the lifting mechanism 218, the lift pins 207 protrude via the through-holes 214, and then the wafer 200 is placed on the lift pins 207. After the wafer 200 is placed on the lift pins 207, the gate valve 205 is opened to unload the wafer 200 from the processing chamber 201.

(3) Effects of the Present Embodiment

According to the present embodiment, the following one or more effects can be achieved.

Figure 5:
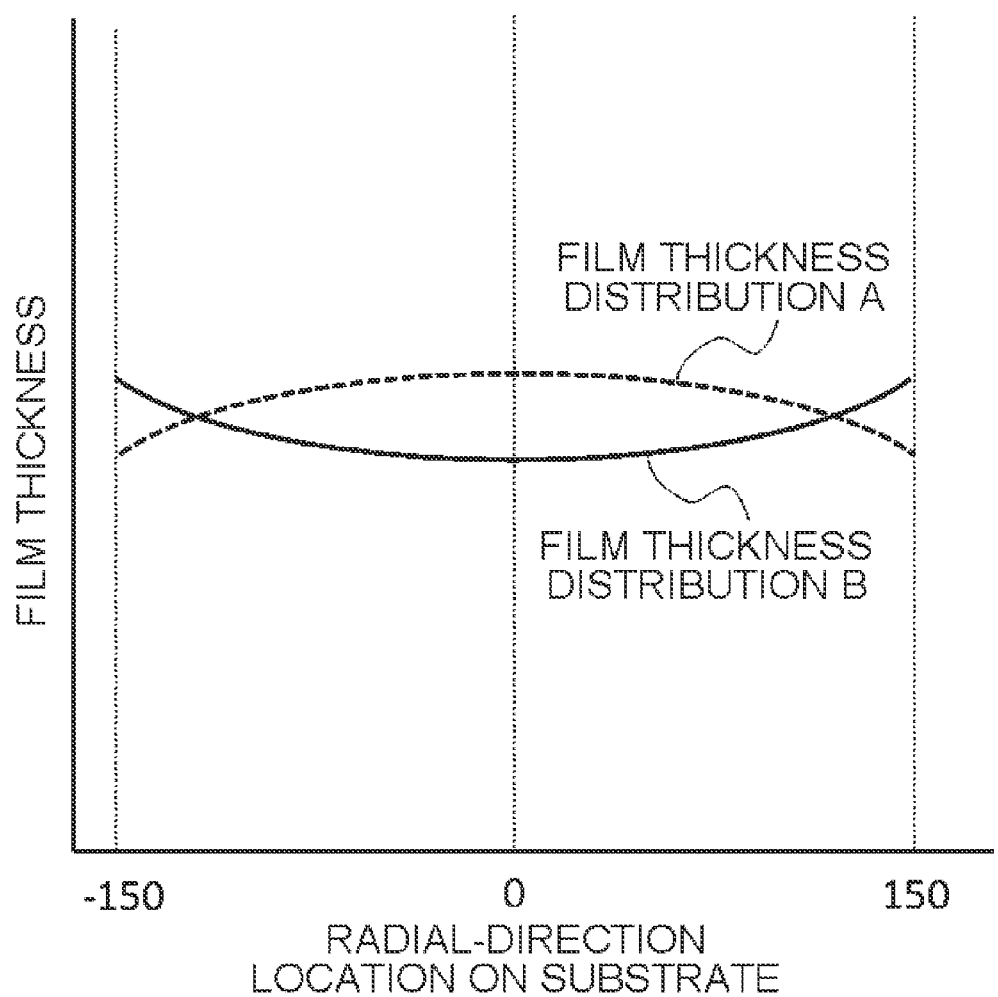
FIG. 5 is a graph illustrating a distribution of thicknesses of a film formed on a substrate according to an embodiment of the present invention.

A thickness distribution of a film formed on a substrate, a quality distribution of the film, or both of the thickness distribution and the quality distribution may be set to be different at a center portion and a peripheral portion of the substrate. For example, a film having a film thickness distribution as illustrated in FIG. 5 may be formed. In the gas supply sequence according to the previous embodiment illustrated in FIG. 4, an effect of supplying a gas from above the wafer 200 may be increased and a film having the film thickness distribution A of FIG. 5 (in which a center portion of a substrate is thicker and a peripheral portion of the substrate is thinner) may be formed. When an effect of supplying a gas from a lateral direction with respect to the wafer 200 is increased, a film having a film thickness distribution B (in which a center portion of a substrate is thinner and a peripheral portion of the substrate is thicker) may be formed. Here, the effect of supplying a gas means an effect of causing one or both of a film thickness distribution and a film quality distribution to be different at the center portion and the peripheral portion of the substrate.

The quality of a film formed on a center portion and a peripheral portion of a substrate may be set to be different. For example, the features of a film, such as a density, a crystalline property, a composition, a resistivity, film stress, an electric property, a permittivity, etc., may be set at the center portion and the peripheral portion of the substrate.

By activating a reactive gas, the difference between the thicknesses or qualities of a film formed on the center portion and the peripheral portion of the wafer 200 may be increased.

By activating the reactive gas using a coil, the states of active species on the center portion and the peripheral portion of the wafer 200 may be set to be different.

Although a gas supply sequence in which a film is formed such that the thicknesses thereof are different at the center portion and the peripheral portion of the wafer 200 are different has been described above, the present invention is not limited thereto and the following sequences may be used.

Figure 6:
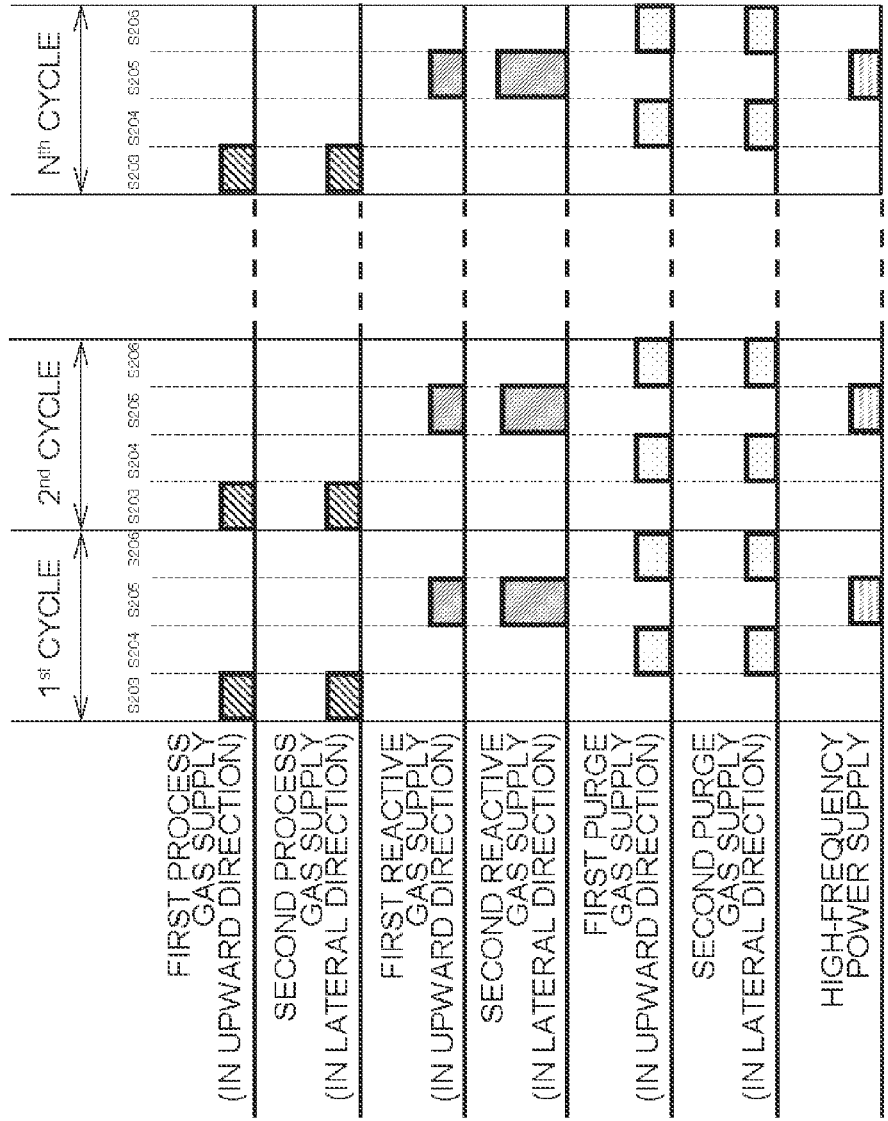
FIG. 6 is a diagram illustrating a sequence of supplying a gas according to another embodiment of the present invention.

For example, a gas supply sequence illustrated in FIG. 6 may be used. As illustrated in FIG. 6, in the reactive gas supply process (operation S205), an effect of supplying a first reactive gas is set to be lower than an effect of supplying a second reactive gas so as to increase an effect of supplying a process gas from a lateral direction with respect to the wafer 200. A film having the film thickness distribution B illustrated in FIG. 5 may be formed using such a gas supply method. Here, for example, the flow rate of the first reactive gas is set to be less than that of the second reactive gas so that the effect of supplying the first reactive gas may be lower than the effect of supplying the second reactive gas.

Figure 7:
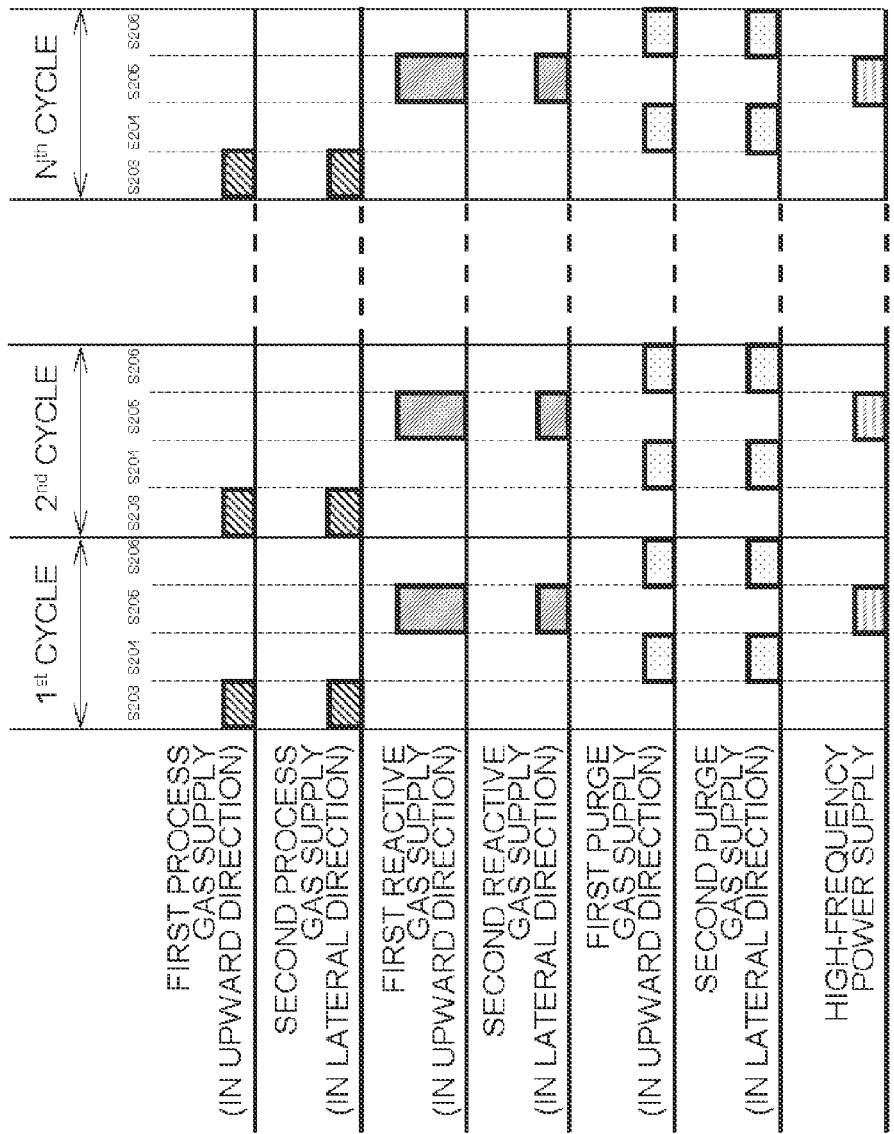
FIG. 7 is a diagram illustrating a sequence of supplying a gas according to another embodiment of the present invention.

Also, a gas supply sequence illustrated in FIG. 7 may be used. As illustrated in FIG. 7, a film having the film thickness distribution A of FIG. 5 may be formed by setting an effect of supplying a first process gas and an effect of supplying a second process gas to be the same in the process gas supply process (operation S203), setting an effect of supplying a first purge gas and an effect of supplying a second purge gas to be the same in the purging processes (operations S204 and S206), and setting an effect of supplying a first reactive gas and an effect of supplying a second reactive gas to be the same in the reactive gas supply process (operation S205) so as to increase the degree of reaction at the center portion of the wafer 200. Here, for example, the flow rate of the first reactive gas is set to be higher than that of the second reactive gas so that the effect of supplying the first reactive gas may be greater than the effect of supplying the second reactive gas.

Figure 8:
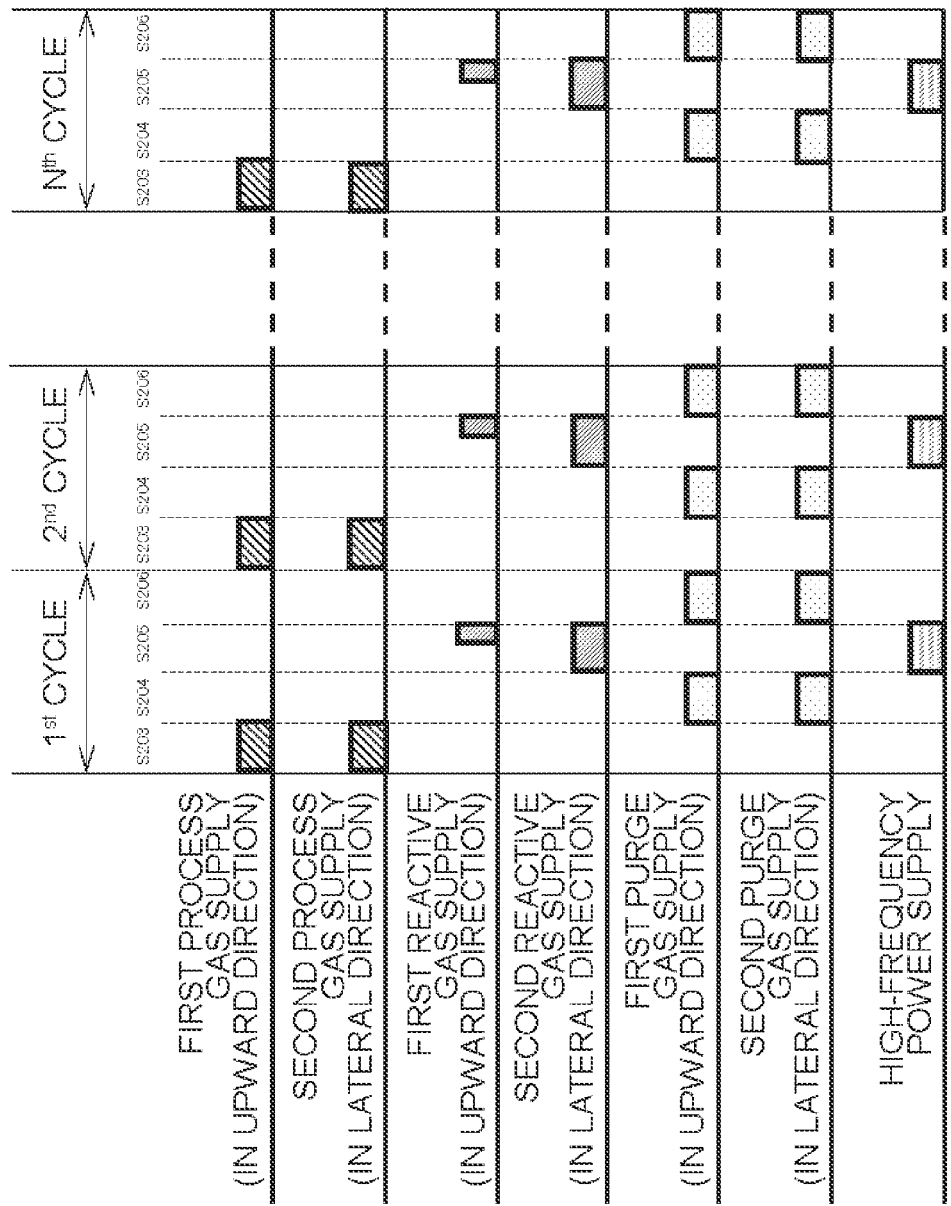
FIG. 8 is a diagram illustrating a sequence of supplying a gas according to another embodiment of the present invention.

Also, a gas supply sequence illustrated in FIG. 8 may be used. As illustrated in FIG. 8, an effect of supplying a reactive gas to the peripheral portion of the wafer 200 may be adjusted to be greater than an effect of supplying the reactive gas to the center portion of the wafer 200 by setting a duration of supplying the first reactive gas to be shorter than a duration of supplying the second reactive gas in the reactive gas supply process (operation S205), thereby forming a film having the film thickness distribution B of FIG. 5.

Figure 11:
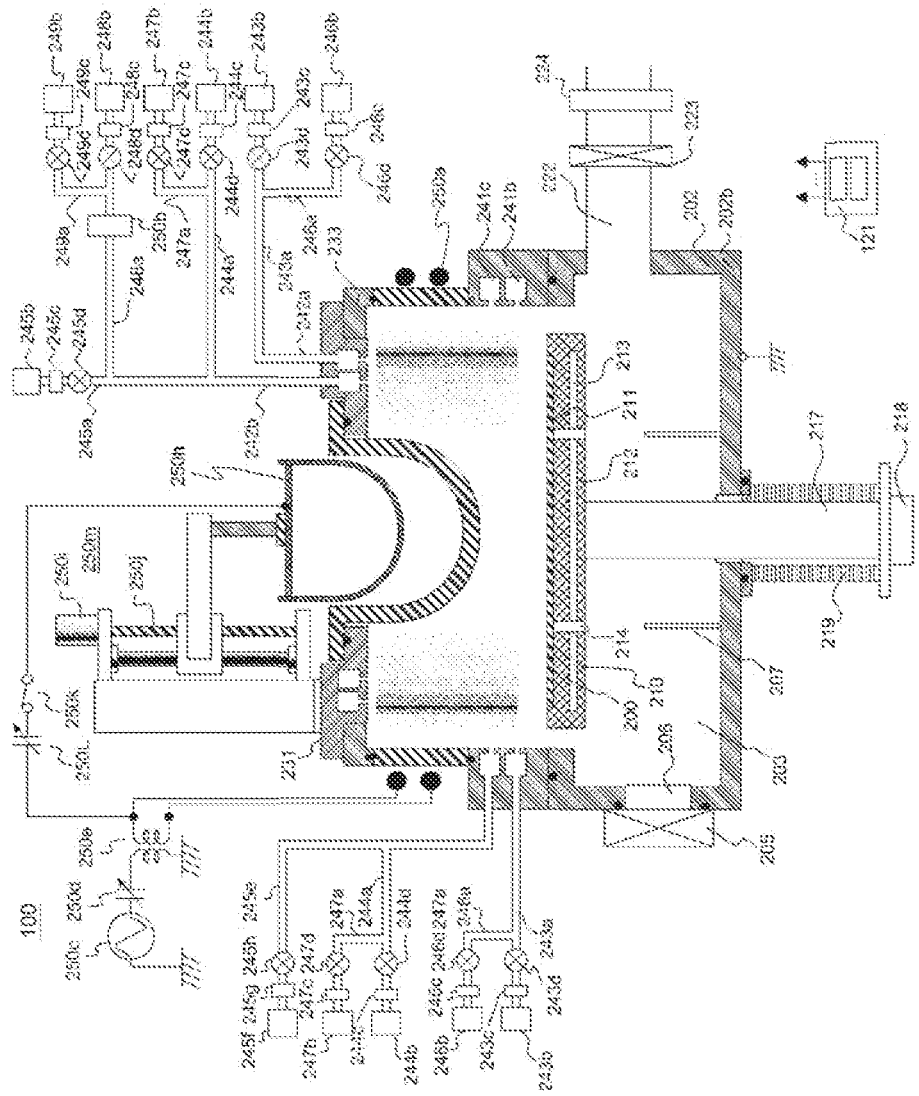
FIG. 11 is a schematic configuration diagram of a substrate processing apparatus according to a third embodiment of the present invention.

Although the processes of sequentially supplying gases have been described in the previous embodiment, the present invention is not limited thereto and gases supplied in one or both of the process gas supply process (operation S203) and the reactive gas supply process (operation S205) may be activated using the coil 250a as an activation unit. In particular, as illustrated in each of the sequence diagrams herein, the reactive gas supplied in the reactive gas supply process (operation S205) may be activated to generate active species having different activities at the center portion of the wafer 200 and cause the reactivity of each of the process gas and the reactive gas to be different at the center portion and the peripheral portion of the wafer 200. Accordingly, the difference between the thicknesses of a film formed on the center portion and the peripheral portion of the wafer 200 may be increased. For example, as illustrated in FIG. 11, a film having the film thickness distribution A of FIG. 5 may be easily formed when gases are set to be activated only when a first reactive gas is supplied, and a film having the film thickness distribution B of FIG. 5 may be easily formed when gases are set to be activated only when a second reactive gas is supplied, Second Embodiment Although the first embodiment has been described above in detail, the present invention is not limited thereto and may be embodied in various forms without departing from the scope of the invention. For example, an embodiment of FIG. 9 may be accomplished.

Figure 9:
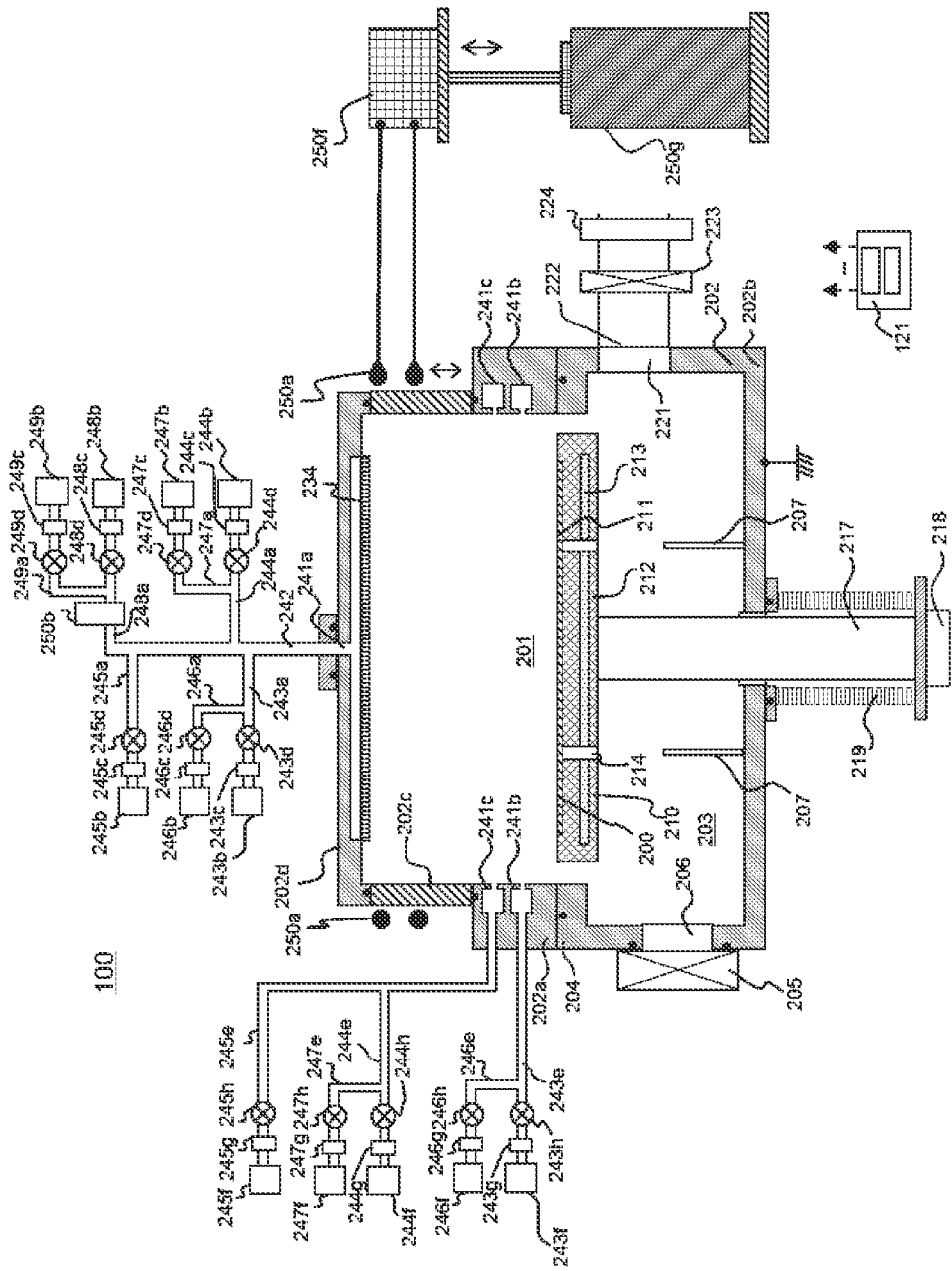
FIG. 9 is a schematic configuration diagram of a substrate processing apparatus according to a second embodiment of the present invention.

Referring to FIG. 9, a coil 250a is configured to be upwardly/downwardly movable. The coil 250a may be moved upward/downward by moving an elevator 250g upward/downward by connecting the coil 250a and a matching box 250f to the elevator 250g.

For example, when the coil 250a is moved upward in a state in which predetermined conditions of supplying a first reactive gas and a second reactive gas are set, the efficiency of processing the center portion of the wafer 200 is greater than the efficiency of processing the peripheral portion of the wafer 200 and thus the thickness of the film on the center portion of the wafer 200 increases, thereby forming a film having the film thickness distribution A of FIG. 5. When the coil 250a is moved downward, the efficiency of processing the peripheral portion of the wafer 200 increases to increase the thickness of a film formed on the peripheral portion of the wafer 200, thereby forming a film having the film thickness distribution B of FIG. 5. As described above, a film thickness distribution may be controlled by changing the location of the coil 250a.

Although one coil is installed and moved here, the present invention is not limited thereto and a plurality of coils may be installed in a direction perpendicular to the wafer 200 and selectively used to control a film thickness distribution. Otherwise, a combination of the gas supply sequences described above may be used to control the thickness of a film at the center portion and the peripheral portion of the wafer 200.

Third Embodiment

Although the second embodiment has been described above in detail, the present invention is not limited thereto and may be embodied in various forms without departing from the scope of the invention.

The inventors of the present invention have found that since plasma was concentrated near an outer circumference of the processing chamber 201 (the coil 250a) in a plasma device using a coil as described above, the peripheral portion of the wafer 200 was easily processed to cause a film to be thickly formed on the peripheral portion compared to the center portion of the wafer 200, and the quality of the film was likely to be changed to make it difficult to control the center portion of the wafer 200. The quality of the film may be determined by, for example, permittivity, resistivity, etc. Thus, the inventors have conducted a study and found that a center portion of a substrate can be easily controlled by adjusting a distribution of plasma using a structure as illustrated in FIG. 10 or 11.

Figure 10:
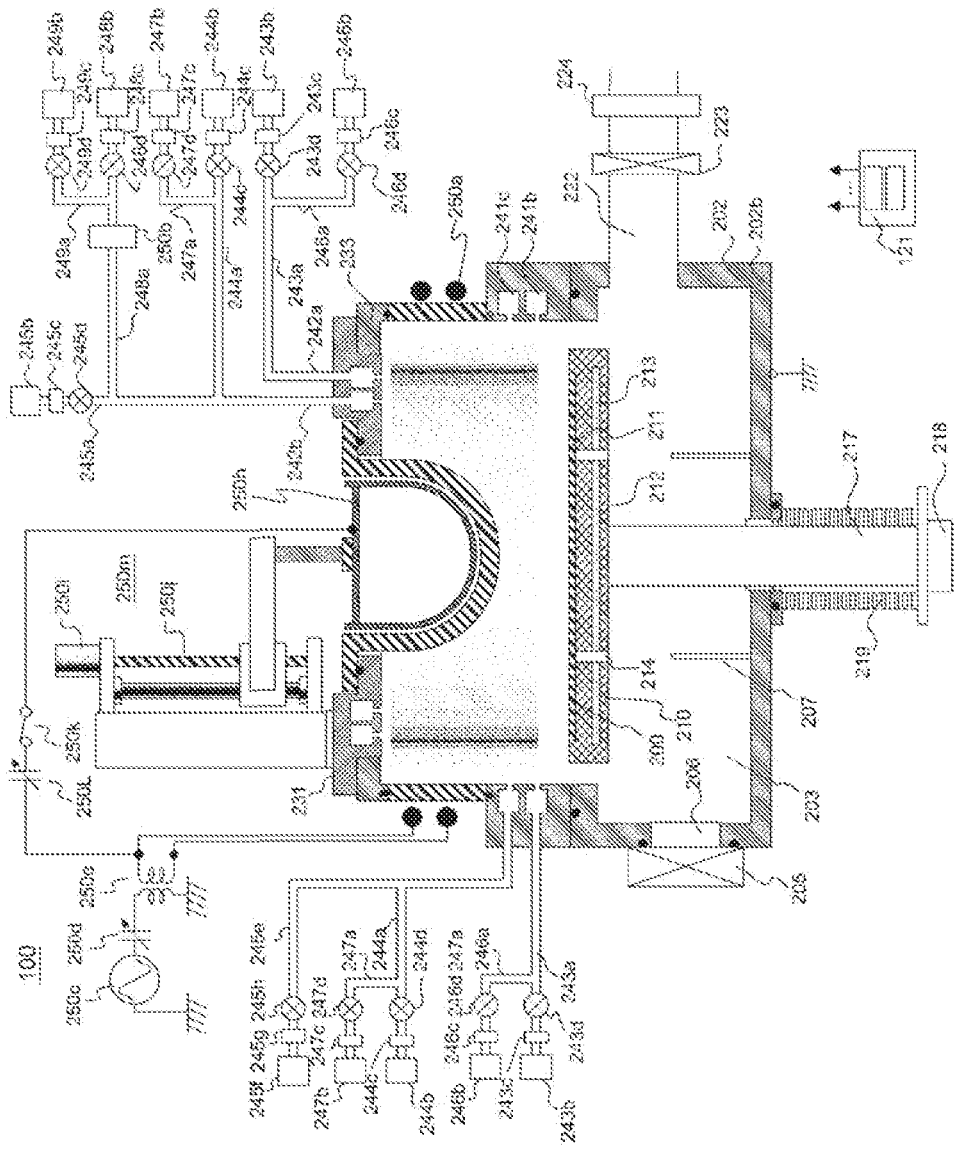
FIG. 10 is a schematic configuration diagram of a substrate processing apparatus according to a third embodiment of the present invention.

Referring to FIGS. 10 and 11, a plasma adjusting electrode 250h is installed to control a distribution of plasma. The plasma adjusting electrode 250h is configured to be upwardly/downwardly movable by an elevator 250m including a motor 250i and a pillar 250j. For example, as illustrated in FIGS. 10 and 11, the plasma adjusting electrode 250h is connected to a coil 250a through a switch 250k and an electric potential adjustment condenser 250L.

When the switch 250k is 'on', a capacitive coupling occurs among the plasma adjusting electrode 250h and the plasma and the coil 250a to induce plasma generated near the coil 250a to the plasma adjusting electrode 250h. Thus, plasma may be generated to the top of the center portion of the wafer 200, thereby improving the activity of the center portion of the wafer 200. Also, the electric potential adjustment condenser 250L may be controlled to control a state of the plasma induced to the plasma adjusting electrode 250h. Furthermore, the plasma-induced state may be controlled by operating the elevator 250m to move the plasma adjusting electrode 250h in an upward/downward direction.

For example, as illustrated in FIG. 10, when the plasma adjusting electrode 250h is moved downward to the processing chamber 201, plasma may be induced near the top of the center portion of the wafer 200 to increase the density of the plasma on the center portion of the wafer 200. In this case, a film having the film thickness distribution A of FIG. 5 may be easily formed. Also, as illustrated in FIG. 11, when the plasma adjusting electrode 250h is moved upward, plasma may be concentrated near the coil 250a to reduce the concentration of the plasma on the center portion of the wafer 200. It this state, a film having the film thickness distribution B of FIG. 5 may be easily formed.

Also, for example, plasma may be induced to the center portion of the wafer 200 by reducing an impedance between the plasma adjusting electrode 250h and the coil 250a by controlling the electric potential adjustment condenser 250L, and may be concentrated on the peripheral portion of the wafer 200 by increasing the impedance between the plasma adjusting electrode 250h and the coil 250a. Thus, a film having the film thickness distribution A or B of FIG. 5 may be formed.

Also, a film thickness distribution may be finely controlled by adjusting each of the heights of the switch 250k, the electric potential adjustment condenser 250L and the plasma adjusting electrode 250h.

Also, when the plasma adjusting electrode 250h is installed outside the process container 202, a plasma generation region may be controlled without influencing the flow of a gas in the process container 202.

Also, the plasma adjusting electrode 250h may be used to control a distribution of radicals or ions of a reactive gas that are in various energy states in the processing chamber 201.

Although various embodiments of the present invention have been described above, the present invention is not limited thereto and may be embodied in various forms without departing from the scope of the invention.

Although a process of manufacturing a semiconductor device has been described above, embodiments of the present invention are not limited thereto. For example, the present invention is applicable to a process of manufacturing a liquid crystal device, a plasma treatment to be performed on a ceramic substrate, etc.

Although a method of forming a film by alternately supplying a process gas and a reactive gas has been described above, the present invention is not limited thereto. For example, the process gas and the reactive gas may be supplied such that pulse timings thereof overlap.

Also, the process gas and the reactive gas may be continuously supplied to form a film by CVD.

Although a process of forming a film has been described above, the present invention is not limited thereto. For example, the present invention is applicable to a substrate processing process in which a film formed on a surface of or on a substrate using one or both of a source gas and a reactive gas is plasma-oxidized or plasma-nitridated. Also, the present invention is applicable to a substrate processing process in which a thermal treatment using a gaseous reaction or plasma annealing is performed using one or both of the source gas and the reactive gas. In particular, when a plasma treatment is performed at low temperatures, the center portion and the peripheral portion of the wafer 200 may be differently processed.

Also, although a method of differently processing the center portion and the peripheral portion of the wafer 200 to be nonuniform has been described above, the present invention is not limited thereto and a supply rate of gases may be controlled to uniformly process the center portion and the peripheral portion of the wafer 200.

Although a process of forming a film on the center portion and the peripheral portion of the wafer 200 to different thicknesses has been described above, the present invention is not limited thereto. For example, a two-step process may be set such that a film having a uniform thickness is formed in a first step and a film is formed on the center portion and the peripheral portion of the wafer 200 in different thicknesses or qualities in a second step.

Figure 12:
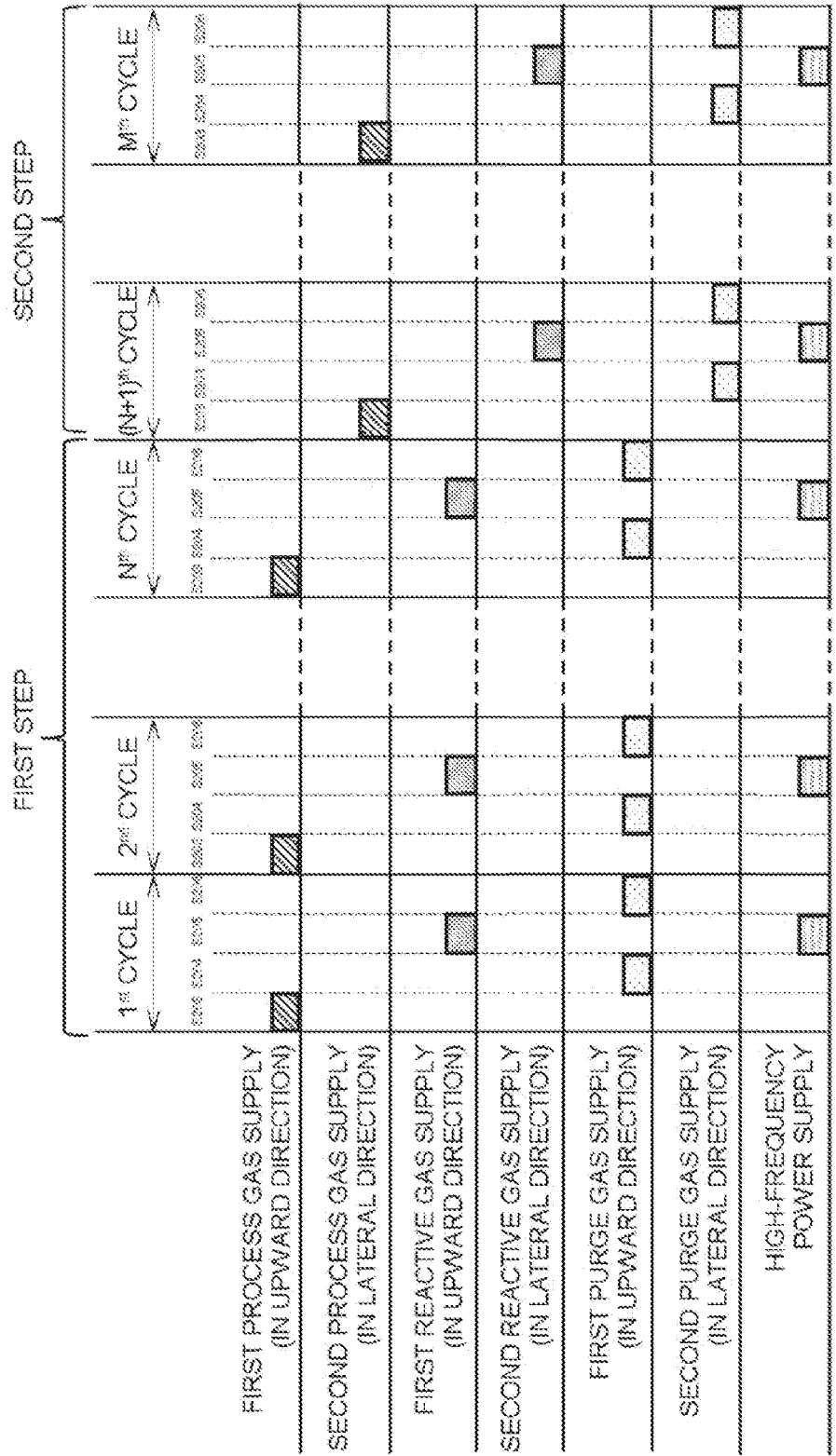
FIG. 12 is a diagram illustrating a sequence of supplying a gas according to another embodiment of the present invention.
Figure 14A:
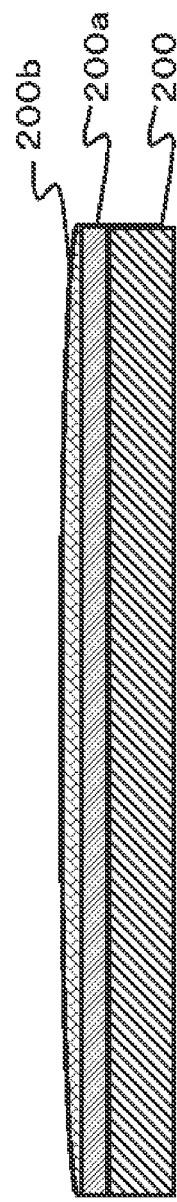
FIGS. 14A and 14B are diagrams illustrating stacked structures of multiple films according to various embodiments of the present invention.
Figure 14B:
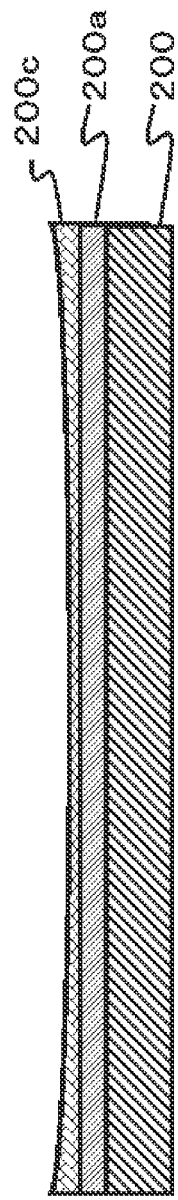

For example, as illustrated in FIG. 12, a film may be formed by performing a first step including a first cycle to an nth cycle and a second step including an (n+1)th cycle to an mth cycle, thereby forming the film having thick peripheral portions as illustrated in FIG. 14B.

Figure 13:
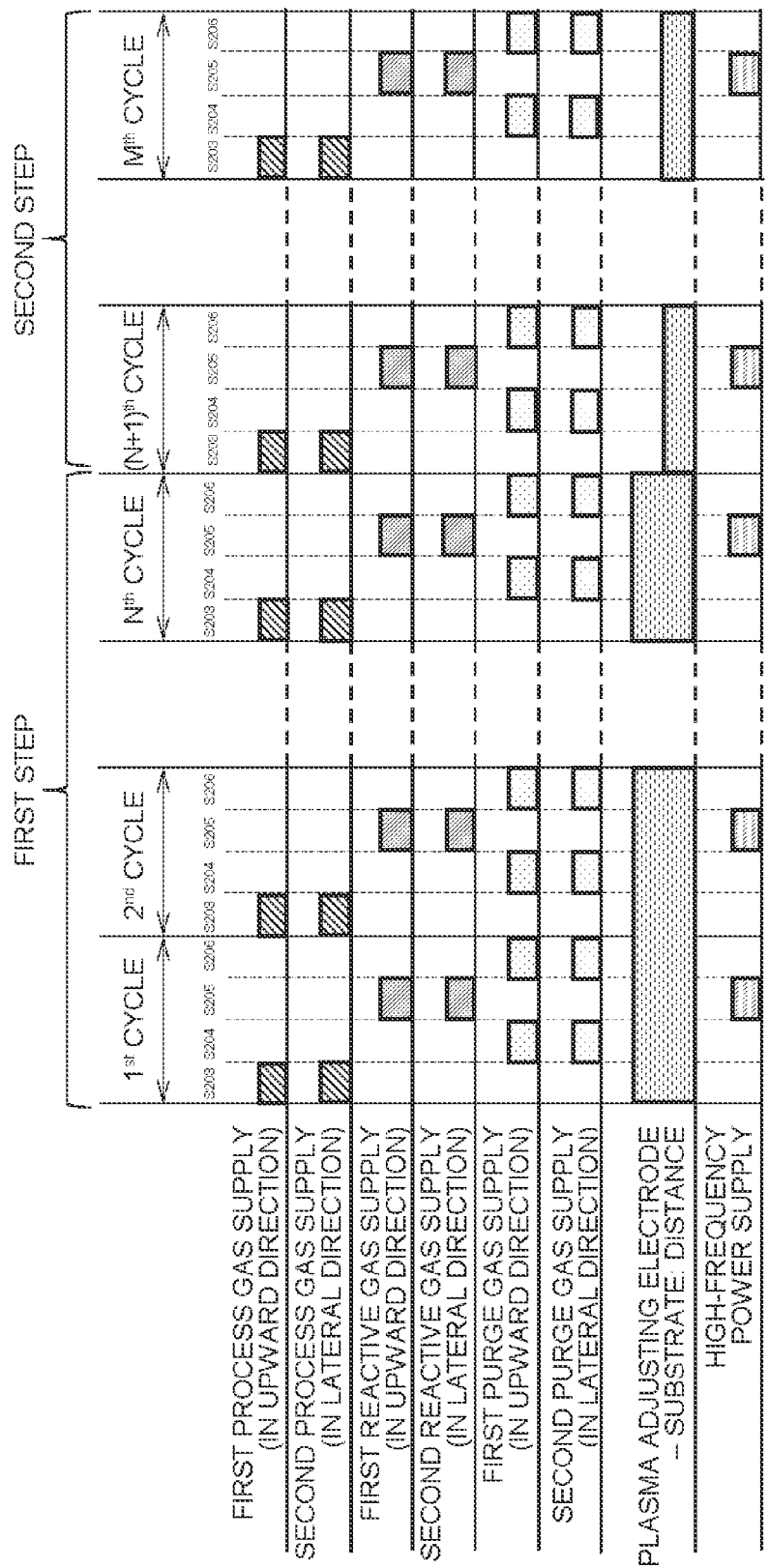
FIG. 13 is a diagram illustrating a sequence of supplying a gas according to another embodiment of the present invention.

Also, for example, as illustrated in FIG. 13, in the apparatus of FIG. 10 or 11, a film as illustrated in FIG. 14A may be formed by setting the distance between the plasma adjusting electrode 250h and the wafer 200 to be different in a first step (including a first cycle to an nth cycle) and a second step (including an (n+1)th cycle to an mth cycle) so that the distance may be shorter in the second step than in the first step.

In FIGS. 14A and 14B, a film 200a is formed in the first step and films 200b and 200c are formed in the second step.

Although a gas supply method or the distance between the plasma adjusting electrode 250h and the wafer 200 is set to be different in the first step and the second step, the present invention is not limited thereto and the gas supply method may be set to be different in arbitrary cycles. For example, a gas supply method or the distance between the plasma adjusting electrode 250h and the wafer 200 may be set to be different in odd-numbered cycles and even-numbered cycles.

Although the plasma adjusting electrode 250a has a hemispherical shape in the previous embodiments, the plasma adjusting electrode 250a may have a plate shape and an upper portion of the process container 202 may also have a flat shape.

Also, a combination of at least two patterns among the gas supply patterns described above with reference to FIGS. 4, 6 to 8, 12, and 13 may be used in every cycle. By combining the gas supply patterns, a film thickness/quality distribution of a film to be formed on the wafer 200 may be tuned in a direction of a plane or the quality of the film may be controlled in a direction of the thickness of the film.

Figure 15:
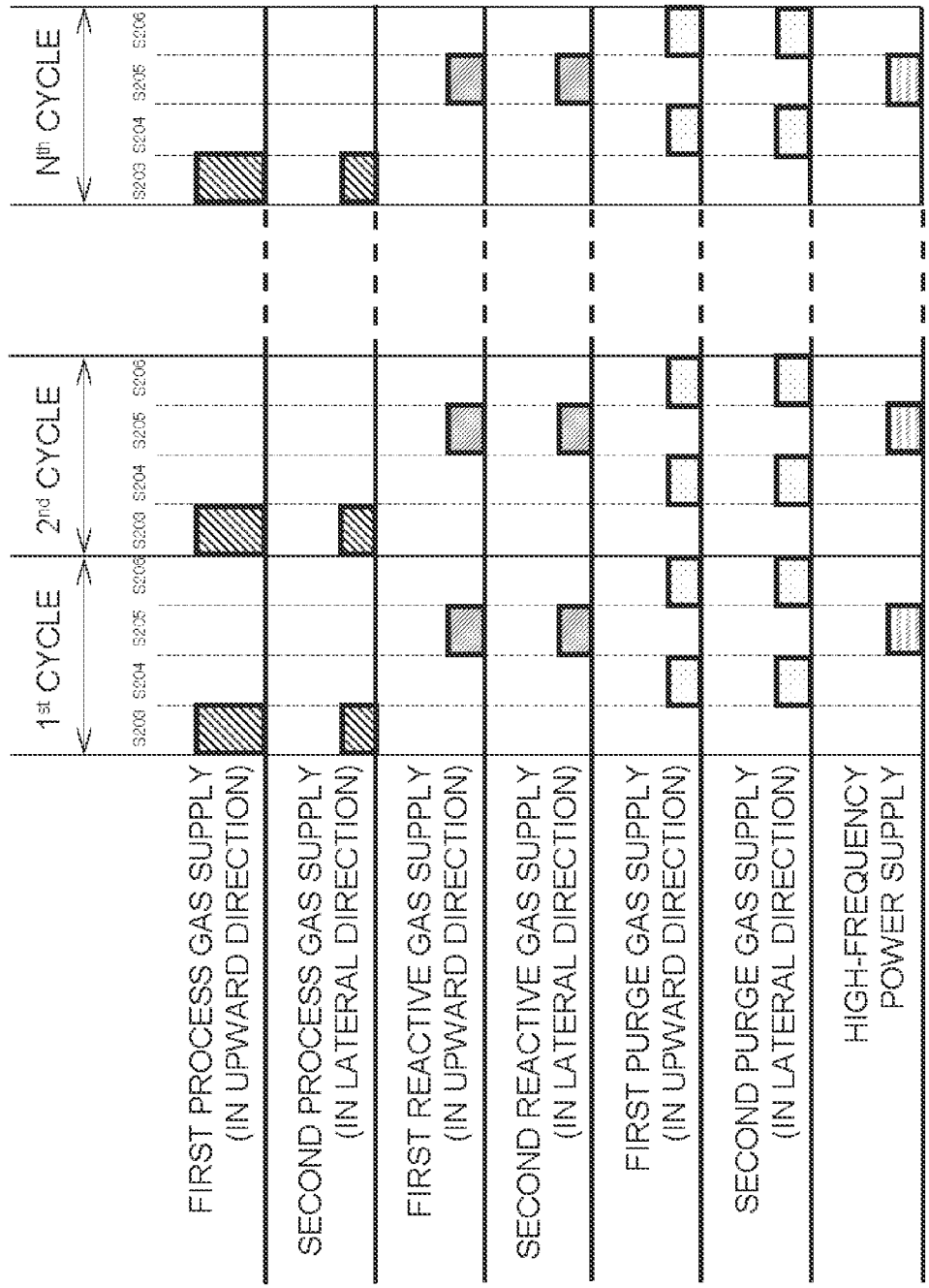
FIG. 15 is a diagram illustrating a sequence of supplying a gas according to another embodiment of the present invention.

Also, although a method of controlling the amount (the flow rate or supply duration) of the reactive gas has been described in the previous embodiments, the amount of the process gas may be controlled according to the sequence of FIG. 15. Also, the sequence of FIG. 15 may be combined with the sequence of controlling the amount of the reactive gas described above. When a film thickness/quality distribution is controlled by adjusting the amount of the process gas, the distance between each gas supply port and the wafer 200 is preferably set to be short.

Also, although the reactive gas is supplied after the process gas is supplied in the previous embodiments, the process gas may be supplied after the reactive gas is supplied.

In a substrate processing apparatus, a method of manufacturing a semiconductor device and a non-transitory computer readable recording medium according to the one or more aspects of the present invention, a film may be formed on a substrate to have different film thicknesses and features within a plane of the substrate and the manufacturing throughput can be improved.

Exemplary Embodiments of the Present Invention

Exemplary embodiments of the present invention will be supplementarily added below.

Supplementary Note 1

According to one aspect of the present invention, there is provided a substrate processing apparatus including: a processing chamber accommodating a substrate; a first process gas supply unit configured to supply a first process gas from above the substrate; a first reactive gas supply unit configured to supply a first reactive gas from above the substrate; a second process gas supply unit configured to supply a second process gas from a lateral direction with respect to the substrate; a second reactive gas supply unit configured to supply a second reactive gas from the lateral direction with respect to the substrate; and a control unit configured to control the first process gas supply unit, the second process gas supply unit, the first reactive gas supply unit, and the second reactive gas supply unit to: (a) supply the first process gas from above the substrate and the second process gas from the lateral direction with respect to the substrate; and (b) supply the first reactive gas from above the substrate and the second reactive gas from the lateral direction with respect to the substrate, wherein each of the steps (a) and (b) is performed at least once in a manner that: a total amount of the first process gas and the second process gas supplied to a center portion of the substrate is different from that of the first process gas and the second process gas supplied to a peripheral portion of the substrate; or a total amount of the first reactive gas and the second reactive gas supplied to the center portion of the substrate is different from that of the first reactive gas and the second reactive gas supplied to the peripheral portion of the substrate in at least one of the steps (a) and (b).

Supplementary Note 2

In the substrate processing apparatus of Supplementary note 1, the control unit is preferably configured to control the first process gas supply unit and the second process gas supply unit such that the total amount of the first process gas and the second process gas supplied to the center portion of the substrate is greater than that of the first process gas and the second process gas supplied to the peripheral portion of the substrate in the step (b).

Supplementary Note 3

In the substrate processing apparatus of Supplementary note 1 or 2, the control unit is preferably configured to control the first reactive gas supply unit and the second reactive gas supply unit such that the total amount of the first reactive gas and the second reactive gas supplied to the center portion of the substrate is greater than that of the first reactive gas and the second reactive gas supplied to the peripheral portion of the substrate in the step (b).

Supplementary Note 4

In the substrate processing apparatus of Supplementary note 1, the control unit is preferably configured to control the first process gas supply unit and the second process gas supply unit such that the total amount of the first process gas and the second process gas supplied to the center portion of the substrate is less than that of the first process gas and the second process gas supplied to the peripheral portion of the substrate in the step (b).

Supplementary Note 5

In the substrate processing apparatus of Supplementary note 1, 2, or 4, the control unit is preferably configured to control the first reactive gas supply unit and the second reactive gas supply unit such that the total amount of the first reactive gas and the second reactive gas supplied to the center portion of the substrate is less than that of the first reactive gas and the second reactive gas supplied to the peripheral portion of the substrate in the step (b).

Supplementary Note 6

The substrate processing apparatus of any one of Supplementary notes 1 to 5, preferably further including a substrate support unit configured to support the substrate, and wherein the control unit is preferably configured to control the substrate support unit to be moved upward or downward, such that one of the total amounts of the first process gas and the second process gas supplied to the center portion and the peripheral portion of the substrate and the total amounts of the first reactive gas and the second reactive gas supplied to the center portion and the peripheral portion of the substrate is different from the other.

Supplementary Note 7

The substrate processing apparatus of any one of Supplementary notes 1 to 6, preferably further including an activation unit configured to excite the first reactive gas and the second reactive gas.

Supplementary Note 8

According to another aspect of the present invention, there is provided a substrate processing apparatus including: a processing chamber accommodating a substrate; a first process gas supply unit configured to supply a first process gas from above the substrate; a first reactive gas supply unit configured to supply a first reactive gas from above the substrate; a second process gas supply unit configured to supply a second process gas from a lateral direction with respect to the substrate; a second reactive gas supply unit configured to supply a second reactive gas from the lateral direction with respect to the substrate; and a control unit configured to control the first process gas supply unit, the second process gas supply unit, the first reactive gas supply unit, and the second reactive gas supply unit to alternately supply the first process gas, the second process gas, the first reactive gas, and the second reactive gas by setting at least one among an amount of the first process gas, an amount of the second process gas, an amount of the first reactive gas, and an amount of the second reactive gas to be different from the other.

Supplementary Note 9

In the substrate processing apparatus of Supplementary note 8, the control unit is preferably configured to control the first process gas supply unit and the second process gas supply unit such that an effect of supplying the first process gas is greater than an effect of supplying the second process gas.

Supplementary Note 10

In the substrate processing apparatus of Supplementary note 9, the control unit is preferably configured to control the first process gas supply unit and the second process gas supply unit such that an effect of supplying the first process gas is greater than an effect of supplying the second process gas and the amount of the first process gas is greater than the amount of the second process gas.

Supplementary Note 11

In the substrate processing apparatus of Supplementary note 8, the control unit is preferably configured to control the first reactive gas supply unit and the second reactive gas supply unit such that an effect of supplying the first reactive gas contributing to improving a film thickness distribution or a film quality distribution of a film to be formed on the substrate is greater than an effect of supplying the second reactive gas.

Supplementary Note 12

In the substrate processing apparatus of Supplementary note 11, the control unit is preferably configured to control the first reactive gas supply unit and the second reactive gas supply unit such that the amount of the first reactive gas is greater than the amount of the second reactive gas to cause the effect of supplying the first reactive gas to be greater than the effect of supplying the second reactive gas.

Supplementary Note 13

In the substrate processing apparatus of Supplementary note 8, the control unit is preferably configured to control the first process gas supply unit and the second process gas supply unit such that an effect of supplying the first process gas contributing to improving a film thickness distribution or a film quality distribution of a film to be formed on the substrate is greater than an effect of supplying the second process gas.

Supplementary Note 14

In the substrate processing apparatus of Supplementary note 13, the control unit is preferably configured to control the first process gas supply unit and the second process gas supply unit such that the amount of the first process gas is less than the amount of the second process gas to cause the effect of supplying the first process gas to be lower than the effect of supplying the second process gas.

Supplementary Note 15

In the substrate processing apparatus of Supplementary note 8, the control unit is preferably configured to control the first reactive gas supply unit and the second reactive gas supply unit such that an effect of supplying the first reactive gas contributing to improving a film thickness distribution or a film quality distribution of a film to be formed on the substrate is less than an effect of supplying the second reactive gas.

Supplementary Note 16

In the substrate processing apparatus of Supplementary note 15, the control unit is preferably configured to control the first reactive gas supply unit and the second reactive gas supply unit such that the amount of the first reactive gas is less than the amount of the second reactive gas to cause the effect of supplying the first reactive gas to be lower than the effect of supplying the second reactive gas.

Supplementary Note 17

In the substrate processing apparatus of any one of Supplementary notes 1 to 16, the control unit is preferably configured to control the first reactive gas supply unit and the second reactive gas supply unit to supply the second reactive gas after the first reactive gas is supplied.

Supplementary Note 18

In the substrate processing apparatus of any one of Supplementary notes 1 to 17, the control unit is preferably configured to control the first reactive gas supply unit and the second reactive gas supply unit to supply the first reactive gas after the supply of the second reactive gas is stopped.

Supplementary Note 19

The substrate processing apparatus of any one of Supplementary notes 1 to 18, preferably further including a plasma adjusting electrode configured to move upward and downward above the processing chamber, and wherein the control unit is preferably configured to control the plasma adjusting electrode to move upward or downward.

Supplementary Note 20

According to another aspect of the present invention, there is provided a method of manufacturing a semiconductor device, the method including: (a) supplying a first process gas from above a substrate and a second process gas from a lateral direction with respect to the substrate; and (b) supplying a first reactive gas from above the substrate and a second reactive gas from the lateral direction with respect to the substrate, wherein each of the steps (a) and (b) is performed at least once in a manner that a total amount of the first process gas and the second process gas supplied to a center portion of the substrate is different from that of the first process gas and the second process gas supplied to a peripheral portion of the substrate; or a total amount of the first reactive gas and the second reactive gas supplied to the center portion of the substrate is different from that of the first reactive gas and the second reactive gas supplied to the peripheral portion of the substrate in at least one of the steps (a) and (b).

Supplementary Note 21

In the method of Supplementary note 20, in the step (a), the total amount of the first process gas and the second process gas supplied to the center portion of the substrate is preferably greater than that of the first process gas and the second process gas supplied to the peripheral portion of the substrate.

Supplementary Note 22

In the method of Supplementary note 20 or 21, in the step (b), the total amount of the first reactive gas and the second reactive gas supplied to the center portion of the substrate is preferably greater than that of the first reactive gas and the second reactive gas supplied to the peripheral portion of the substrate.

Supplementary Note 23

In the method of Supplementary note 20, in the step (a), the total amount of the first process gas and the second process gas supplied to the center portion of the substrate is preferably less than that of the first process gas and the second process gas supplied to the peripheral portion of the substrate.

Supplementary Note 24

In the method of Supplementary note 20, 21, or 23, in the step (b), the total amount of the first reactive gas and the second reactive gas supplied to the center portion of the substrate is preferably less than that of the first reactive gas and the second reactive gas supplied to the peripheral portion of the substrate.

Supplementary Note 25

The method of any one of Supplementary notes 20 to 24, preferably further including moving the substrate upward or downward before the step (a) or (b).

Supplementary Note 26

The method of any one of Supplementary notes 20 to 25, preferably further including activating the first reactive gas and the second reactive gas.

Supplementary Note 27

According to another aspect of the present invention, there is provided a method of manufacturing a semiconductor device, the method including: (a) supplying a first process gas from above a substrate and supplying a second process gas from a lateral direction with respect to the substrate such that an amount of the supplied second process gas is different from an amount of the supplied first process gas; (b) supplying a first reactive gas from above the substrate and supplying a second reactive gas from the lateral direction with respect to the substrate such that an amount of the supplied second reactive gas is different from an amount of the supplied first reactive gas; and (c) activating the first reactive gas and the second reactive gas.

Supplementary Note 28

In the method of Supplementary note 27, in the step (a), an effect of supplying the first process gas contributing to improving a film thickness distribution or a film quality distribution of a film to be formed on the substrate is preferably greater than an effect of supplying the second process gas.

Supplementary Note 29

In the method of Supplementary note 27 or 28, in the step (b), an effect of supplying the first reactive gas contributing to improving the film thickness distribution or the film quality distribution of the film to be formed on the substrate is preferably greater than an effect of supplying the second reactive gas.

Supplementary Note 30

In the method of Supplementary note 27, in the step (a), an effect of supplying the first process gas contributing to improving a film thickness distribution or a film quality distribution of a film to be formed on the substrate is preferably less than an effect of supplying the second process gas.

Supplementary Note 31

In the method of Supplementary note 27 or 28, in the step (b), an effect of supplying the first reactive gas contributing to improving the film thickness distribution or the film quality distribution of the film to be formed on the substrate is preferably less than an effect of supplying the second reactive gas.

Supplementary Note 32

In the method of any one of Supplementary notes 27 to 31, in the step (b), the second reactive gas is preferably supplied after the first reactive gas is supplied.

Supplementary Note 33

In the method of any one of Supplementary notes 27 to 31, in the step (b), the first reactive gas is preferably supplied after the supply of the second reactive gas is stopped.

Supplementary Note 34

The method of any one of Supplementary notes 27 to 33, preferably further including moving a plasma adjusting electrode installed above the substrate upward or downward before performing the step (c).

Supplementary Note 35

In the method of any one of Supplementary notes 27 to 34, the amount is preferably a gas flow rate.

Supplementary Note 36

In the method of any one of Supplementary notes 27 to 35, the amount is preferably a gas supply duration.

Supplementary Note 37

According to another aspect of the present invention, there is provided a program causing a computer to perform: (a) supplying a first process gas from above a substrate and a second process gas from a lateral direction with respect to the substrate; and (b) supplying a first reactive gas from above the substrate and a second reactive gas from the lateral direction with respect to the substrate, wherein each of the sequences (a) and (b) is performed at least once in a manner that a total amount of the first process gas and the second process gas supplied to a center portion of the substrate is different from that of the first process gas and the second process gas supplied to a peripheral portion of the substrate; or a total amount of the first reactive gas and the second reactive gas supplied to the center portion of the substrate is different from that of the first reactive gas and the second reactive gas supplied to the peripheral portion of the substrate in at least one of the sequences (a) and (b).

Supplementary Note 38

According to another aspect of the present invention, there is provided a non-transitory computer readable recording medium causing a computer to perform: (a) supplying a first process gas from above a substrate and a second process gas from a lateral direction with respect to the substrate; and (b) supplying a first reactive gas from above the substrate and a second reactive gas from the lateral direction with respect to the substrate, wherein each of the sequences (a) and (b) is performed at least once in a manner that a total amount of the first process gas and the second process gas supplied to a center portion of the substrate is different from that of the first process gas and the second process gas supplied to a peripheral portion of the substrate; or a total amount of the first reactive gas and the second reactive gas supplied to the center portion of the substrate is different from that of the first reactive gas and the second reactive gas supplied to the peripheral portion of the substrate in at least one of the sequences (a) and (b).

Supplementary Note 39

In the non-transitory computer readable recording medium of Supplementary note 38, in the sequence (a), the total amount of the first process gas and the second process gas supplied to the center portion of the substrate is preferably greater than that of the first process gas and the second process gas supplied to the peripheral portion of the substrate.

Supplementary Note 40

In the non-transitory computer readable recording medium of Supplementary note 38 or 39, in the sequence (b), the total amount of the first reactive gas and the second reactive gas supplied to the center portion of the substrate is preferably greater than that of the first reactive gas and the second reactive gas supplied to the peripheral portion of the substrate in the sequence (b).

Supplementary Note 41

In the non-transitory computer readable recording medium of Supplementary note 38, in the sequence (a), the total amount of the first process gas and the second process gas supplied to the center portion of the substrate is preferably less than that of the first process gas and the second process gas supplied to the peripheral portion of the substrate.

Supplementary Note 42

In the non-transitory computer readable recording medium of Supplementary note 38 or 41, in the sequence (b), the total amount of the first reactive gas and the second reactive gas supplied to the center portion of the substrate is preferably less than that of the first reactive gas and the second reactive gas supplied to the peripheral portion of the substrate in the sequence (b).

Supplementary Note 43

The non-transitory computer readable recording medium of any one of Supplementary notes 38 to 41, preferably further including (c) moving the substrate upward or downward before the sequence (a) or (b).

Supplementary Note 44

The non-transitory computer readable recording medium of any one of Supplementary notes 38 to 43, preferably further including (d) exciting the first reactive gas and the second reactive gas.

What is claimed is:

1. A substrate processing apparatus comprising:
a process container accommodating a substrate;
a first process gas supply unit configured to supply a first process gas to a center portion of the substrate from above the substrate;
a first reactive gas supply unit configured to supply a first reactive gas to the center portion of the substrate from above the substrate;
a second process gas supply unit configured to supply a second process gas to the center portion of the substrate from a lateral direction with respect to the substrate;
a second reactive gas supply unit configured to supply a second reactive gas to the center portion of the substrate from the lateral direction with respect to the substrate;
an activation unit configured to activate at least one of the first reactive gas and the second reactive gas to generate plasma;
a plasma adjusting electrode installed above the center portion of the substrate outside the process container, wherein the plasma adjusting electrode is configured to adjust densities of the plasmas at the center portion and at a peripheral portion of the substrate and control the plasma adjusting electrode to move upward and downward; and
a control unit configured to control the first process gas supply unit, the second process gas supply unit, the first reactive gas supply unit, the second reactive gas supply unit, the activation unit, and the plasma adjusting electrode.

2. The substrate processing apparatus of claim 1, wherein the control unit is configured to control the first reactive gas supply unit and the second reactive gas supply unit in a manner that an amount of the first reactive gas supplied from above the substrate is greater than that of the second reactive gas supplied from the lateral direction with respect to the substrate.

3. The substrate processing apparatus of claim 1, wherein the control unit is configured to control the first reactive gas supply unit and the second reactive gas supply unit in a manner that an amount of the first reactive gas supplied from above the substrate is less than that of the second reactive gas supplied from the lateral direction with respect to the substrate.

4. The substrate processing apparatus of claim 1, wherein the control unit is configured to control the first process gas supply unit and the second process gas supply unit in a manner that an amount of the first process gas supplied is greater than that of the second process gas supplied.

5. The substrate processing apparatus of claim 1, wherein the control unit is configured to control the first process gas supply unit and the second process gas supply unit in a manner that an amount of the first process gas supplied is less than that of the second process gas supplied.

6. The substrate processing apparatus of claim 1, wherein the control unit is configured to control the first reactive gas supply unit and the second reactive gas supply unit to supply the second reactive gas after the first reactive gas is supplied.

7. The substrate processing apparatus of claim 1, wherein the control unit is configured to control the first reactive gas supply unit and the second reactive gas supply unit to supply the first reactive gas after a supply of the second reactive gas is stopped.

8. The substrate processing apparatus of claim 1, wherein the control unit is configured to control the first reactive gas supply unit and the second reactive gas supply unit to start a supply of the first reactive gas after starting a supply of the second reactive gas.

9. The substrate processing apparatus of claim 1, wherein the control unit is configured to control the first process gas supply unit, the second process gas supply unit, the first reactive gas supply unit and the second reactive gas supply unit to alternately supply the second process gas and the second reactive gas after alternately supplying the first process gas and the first reactive gas.

10. The substrate processing apparatus of claim 1, further comprising a substrate support unit configured to support the substrate, and wherein the control unit is configured to control the substrate support unit to move upward or downward such that one of the total amounts of the first process gas and the second process gas supplied to the center portion and the peripheral portion of the substrate and the total amounts of the first reactive gas and the second reactive gas supplied to the center portion and the peripheral portion of the substrate is different from the other.

11. The substrate processing apparatus of claim 1, wherein the plasma adjusting electrode protrudes from a lid of the process container toward the substrate.

12. The substrate processing apparatus of claim 1, wherein the activation unit is installed at a side of the process container.

13. The substrate processing apparatus of claim 1, wherein the control unit is configured to control the first process gas supply unit, the second process gas supply unit, the first reactive gas supply unit and the second reactive gas supply unit to perform: (a) supplying the first process gas and the second process gas, and the first reactive gas; and (b) supplying the first reactive gas and the second reactive gas at least once with a distance between the plasma adjusting electrode and the substrate at a first distance; and to perform (a) and (b) at least once with the distance between the plasma adjusting electrode and the substrate at a second distance.

14. The substrate processing apparatus of claim 13, wherein the second distance is shorter than the first distance.

15. The substrate processing apparatus of claim 1, further comprising an electric potential adjustment condenser connected to the plasma adjusting electrode and configured to control an electric potential of the plasma adjusting electrode.

16. The substrate processing apparatus of claim 15, wherein the plasma adjusting electrode is connected to the activation unit via the electric potential adjustment condenser.

17. The substrate processing apparatus of claim 1, further comprising an elevator configured to move the plasma adjusting electrode upward and downward.

18. The substrate processing apparatus of claim 17, wherein the control unit is configured to control the elevator to move the plasma adjusting electrode downward.

19. The substrate processing apparatus of claim 17, wherein the control unit is configured to control the elevator to move the plasma adjusting electrode upward.

* * * * *